(12) United States Patent
Ino

(10) Patent No.: US 7,513,154 B2
(45) Date of Patent: Apr. 7, 2009

(54) SEMICONDUCTOR ACCELERATION SENSOR DEVICE AND FABRICATION METHOD THEREOF

(75) Inventor: Yoshihiko Ino, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 313 days.

(21) Appl. No.: 11/436,553

(22) Filed: May 19, 2006

(65) Prior Publication Data

US 2006/0266117 A1    Nov. 30, 2006

(30) Foreign Application Priority Data

May 30, 2005    (JP)    ............... 2005-157920

(51) Int. Cl.
*G01P 15/125*    (2006.01)
(52) U.S. Cl. .................... 73/493; 73/514.33; 438/51
(58) Field of Classification Search .......... 73/493, 73/514.01, 514.32, 514.33; 438/51
See application file for complete search history.

(56) References Cited

U.S. PATENT DOCUMENTS 6,810,736 B2 * 11/2004 Ikezawa et al. ............... 73/493
6,848,306 B2 * 2/2005 Kunda ..................... 73/514.01

FOREIGN PATENT DOCUMENTS

JP    06-289048    10/1994
JP    2004-198243    7/2004

* cited by examiner

*Primary Examiner*—John E Chapman
(74) *Attorney, Agent, or Firm*—Rabin & Berdo, PC

(57) ABSTRACT

A semiconductor acceleration sensor device has an acceleration sensor chip and a hollow package to house the acceleration sensor chip. A concave section is formed in a predetermined area on a bottom face inside the package. The semiconductor acceleration sensor device also has a low elasticity element with adhesiveness. The low elasticity element is filled in the concave section. The acceleration sensor chip is mounted on the low elasticity element. The adhesive surface between the low elasticity element and the acceleration sensor chip is higher than the bottom face.

18 Claims, 16 Drawing Sheets

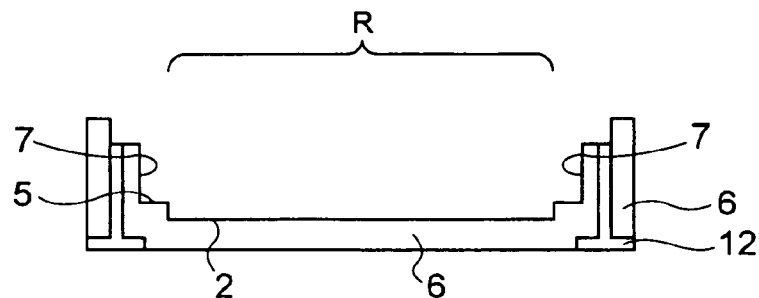
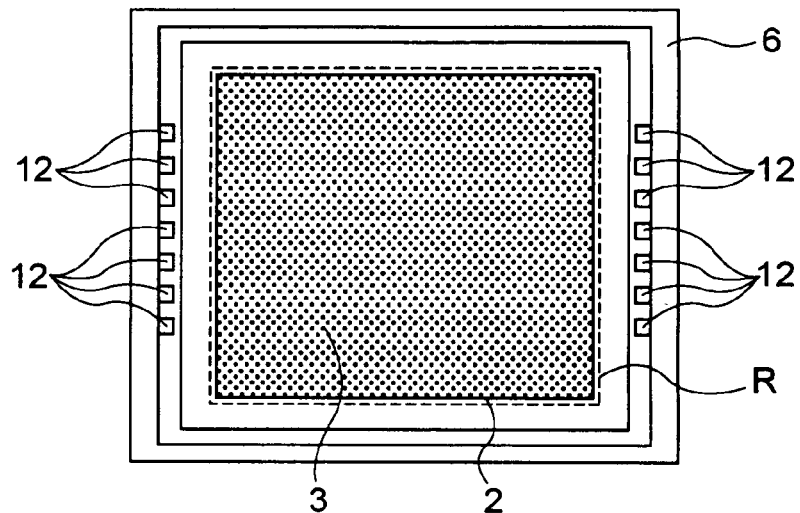
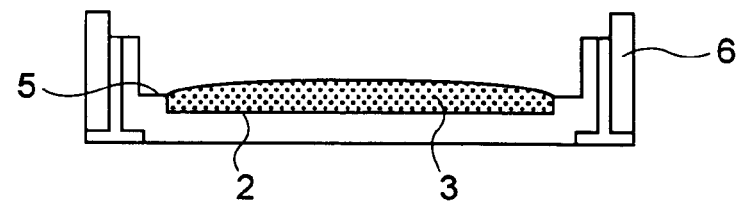
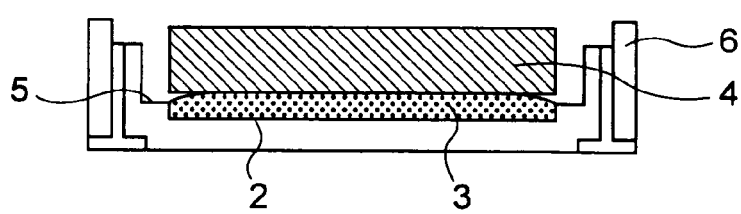
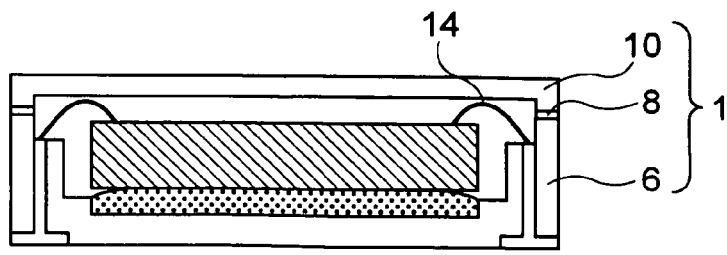

SEMICONDUCTOR ACCELERATION SENSOR DEVICE AND FABRICATION METHOD THEREOF

BACKGROUND OF THE INVENTION

1. Field of the Invention

The present invention relates to a semiconductor acceleration sensor device having an acceleration sensor chip mounted on a package.

2. Description of the Related Art

A typical conventional semiconductor acceleration device has an acceleration sensor chip for outputting an electric signal in accordance with a magnitude and direction of applied acceleration, and the acceleration sensor chip is mounted on a package. Various types of semiconductor acceleration sensor devices have been known in the art. One example is a semiconductor acceleration sensor device having the structure shown in FIG. 17 of the accompanying drawings. In this semiconductor acceleration sensor device, the acceleration sensor chip 4' shown in FIG. 16 of the accompanying drawings is mounted on the package 1'. This conventional acceleration sensor device will be described with reference to FIG. 16 and FIG. 17.

The acceleration sensor chip 4' includes a frame that has four beams 18' extending inward. A weight 16' is supported at the center of the frame by the four beams 18'. A piezoresistance element 20' is attached to each beam 18'. Because of this structure, if the weight 16' moves in the X, Y or Z direction, some beams 18' stretch and other beams 18' shrink, and the resistance values of the piezoresistance elements 20' change. The piezoresistance elements 20' in the respective axis directions constitute a bridge circuit, and the changes of the resistance values are output as electric signals and computed. Accordingly, the direction and magnitude of the applied acceleration can be detected. This type of acceleration sensor is disclosed in, for example, Japanese Patent Application Kokai (Laid-Open) No. 2004-198243.

Because the acceleration sensor chip 4' has a mechanism to sense the movement of the weight 16', the package 1' for mounting the acceleration sensor chip 4' must be hollow inside.

The acceleration sensor chip 4' is adhered to the bottom face 5' inside the package 1 by a low elasticity element 3', such as silicon rubber, which has adhesiveness. The low elasticity element 3' is used because the shock resistance of the acceleration sensor chip 4' is secured. The low elasticity element 3' is formed by coating a certain liquid on the bottom face 5' and curing it.

Another example of the semiconductor acceleration sensor device is disclosed in Japanese Patent No. 3517428.

In the above described conventional semiconductor acceleration sensor devices, the thermal expansion coefficient of the low elasticity element for adhering the acceleration sensor chip to the bottom face inside the package is greater than the thermal expansion coefficient of the acceleration sensor chip. As a result, distortion is generated in the acceleration sensor chip if the ambient temperature changes. If distortion is generated in the acceleration sensor chip, the piezoelements are affected. This affects the detection of acceleration. In other words, acceleration cannot be detected accurately if the temperature changes.

SUMMARY OF THE INVENTION

According to a first aspect of the present invention, there is provided a semiconductor acceleration sensor device that includes an acceleration sensor chip, and a hollow package to house the acceleration sensor chip. A concave section is formed in a predetermined area on a bottom face inside the package. The semiconductor acceleration sensor device also includes a low elasticity element with adhesiveness, which is filled in the concave section. The acceleration sensor chip is mounted on the low elasticity element. The adhesive surface between the low elasticity element and the acceleration sensor chip is higher than the bottom face.

In this specification, "a predetermined area" is a flat area on the bottom face inside the package. Also, "shape", "size" and "position" referred to concerning the predetermined area, concave section, low elasticity element and acceleration sensor chip all mean planar shape, size and position. The term "circle" includes both a true circle and ellipse.

Since the low elasticity element is filled in the concave section, the dimensional change of the low elasticity element when the ambient temperature changes occurs mainly in the vertical direction, and the dimensional change in the horizontal direction can be suppressed. In other words, the distortion generated on the acceleration sensor chip by the temperature change is suppressed. Therefore, the detection accuracy of the acceleration sensor can be improved.

BRIEF DESCRIPTION OF THE DRAWINGS

FIG. 4A to FIG. 4E are a combination of cross-sectional views and a plan view to show a series of fabrication steps to make the semiconductor acceleration sensor device according to the first embodiment;

FIG. 5A to FIG. 5C are a combination of a cross-sectional view and plan views to depict a first modification to the fabrication method according to the first embodiment, wherein FIG. 5A is a cross-sectional view taken along the line 5A-5A in FIG. 1A, FIG. 5B is a plan view and FIG. 5C is another plan view;

FIG. 6A to FIG. 6C are a combination of a cross-sectional view and plan views to depict a second modification to the fabrication method according to the first embodiment, wherein FIG. 6A is a cross-sectional view taken along the line 6A-6A in FIG. 1A, FIG. 6B is a plan view and FIG. 6C is another plan view;

DETAILED DESCRIPTION OF THE INVENTION

Embodiments of the present invention will now be described. Each embodiment is merely an example. The scope of the present invention shall not be limited to these embodiments.

First Embodiment

The structure and fabrication method of the semiconductor acceleration sensor device according to the first embodiment of the present invention will be described with reference to FIG. 1A through FIG. 4E. FIG. 3A and FIG. 3B show examples when the shape, size and position of the low elasticity element 3 are different from those of the low elasticity element 3 shown in FIG. 2A.

Figure 1A:
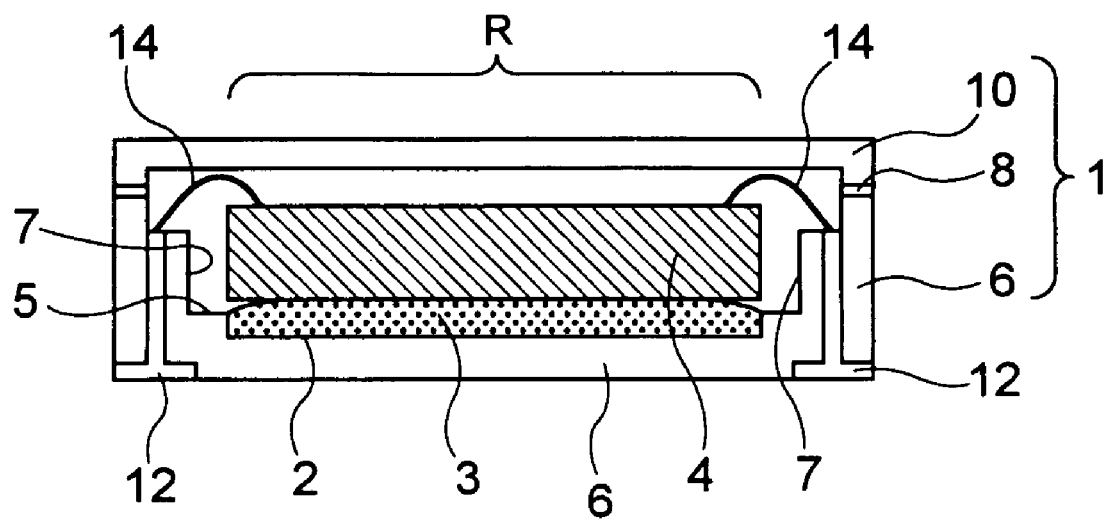
FIG. 1A is a cross-sectional view of a semiconductor acceleration sensor device according to the first embodiment, taken along the line 1A-1A in FIG. 1B.

Referring to FIG. 1A, the acceleration sensor chip 4 for generating electric signals according to the magnitude and direction of the applied acceleration is housed inside the hollow package 1. The package 1 includes the chip housing section 6 made of ceramic and the top cover 10 made of ceramic. The top cover 10 is placed over the chip housing section 6. The top cover 10 is fixed to the chip housing section 6 by adhesive 8 to cover (close) the chip housing section 6. The acceleration sensor chip 4, housed inside the package 1, is sealed in by the package 1. In the chip housing section 6, a plurality of conductive package electrodes 12 are buried at a plurality of locations. Inside the chip housing section 6, the concave section 2 is formed in the bottom face 5 inside the package 1. The concave section 2 is formed in a predetermined area R on the bottom face 5. In this particular embodiment, the shape, size and position of the concave section 2 are the same as those of the predetermined area R. It can be said that the chip housing section 6 has a first concave section defined by the side faces 7 and the bottom face 5, and the concave section 2 (second concave section) is formed in the predetermined area R on the bottom face 5.

In the concave section 2, the low elasticity element 3 made of silicon rubber is filled. The low elasticity element 3 fills the concave section 2 so that the configuration of the low elastic element 3 is defined by the side walls of the concave section 2. In this embodiment, therefore, the shape, size and position of the low elasticity element 3 are the same as those of the concave section 2 and the predetermined area R. The acceleration sensor chip 4 is mounted on the low elasticity element 3 by adhesive. The low elasticity element 3 itself serves as the adhesive to hold the sensor chip 4 thereon. The adhered face between the low elasticity element 3 and the acceleration sensor chip 4 is slightly higher than the bottom face 5. This is because clearance is needed when the package 1 receives a shock from the outside, so that the acceleration sensor chip 4 does not hit the bottom face 5. The electrodes (not shown) of the acceleration sensor chip 4 are electrically connected to the package electrodes 12 by wires 14.

Package 1 is 6.0 mm wide and 0.85 mm high. The depth of the concave section 2 is 75 μm, but is acceptable if it is in the 50-100 μm range. The adhesive surface between the low elasticity element 3 and the acceleration sensor chip 4 is preferably about 10 μm higher than the bottom face 5. A gap, not adhered to the acceleration sensor chip 4, is generated at the edge of the top face of the low elasticity element 3 in the illustrated embodiment, but this gap may not be generated in some cases. The low elasticity element 3 is not formed on the bottom face 5 where the concave section 2 does not exist.

For the material of the low elasticity element 3, silicon rubber is preferable, but a material other than silicon rubber may be used if the elastic modulus is 100 MPa or less, and the material has adhesiveness. For example, fluoro-rubber can be used.

Figure 17:
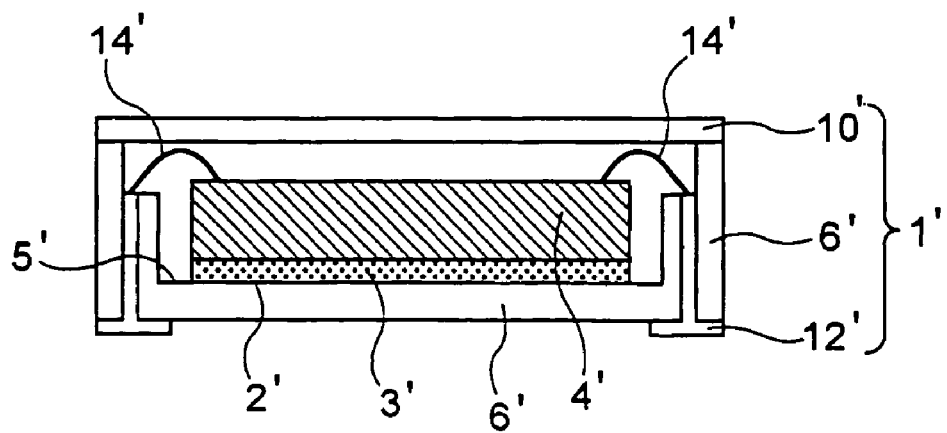
FIG. 17 is a cross-sectional view of a conventional semiconductor acceleration sensor device.

The top cover 10 and the chip housing section 6 of this embodiment have a structure different from the conventional structure shown in FIG. 17. Specifically, the top cover 10' of the conventional structure is a flat plate until the edge in the cross-sectional structure, but the top cover 10 of the present embodiment has the edge protruding downward. In other words, the top cover 10 of the first embodiment has a concave shape. Also, the structure of the chip housing section 6 to receive the package electrodes 12 is different. Specifically, the lower ends of the package electrodes 12' protrude from the back face of the chip housing section 6' in the prior art, but in the present embodiment, the lower ends of the package electrodes 12 are buried in the chip housing section 6, and do not protrude from the back face of the chip housing section 6. Therefore, the back face of the chip housing section 6 is flat in the FIG. 1A embodiment. The structure of the top cover 10 and the chip housing section 6 is different from the conventional structure, because the thickness of the top cover 10, other than the edge, is less than the thickness of the top cover 10' of the conventional structure, so that the thickness of the entire package 1 is decreased. It should be noted, however, that the edge of the top cover 10 has the same thickness as the conventional top cover 10' to maintain the strength. The reason why the bottoms of the package electrodes 12 are buried in the chip housing section 6 is because the height of the acceleration sensor device can be decreased.

It should be noted that the top cover 10' and the chip housing section 6' shown in FIG. 17 may be used instead of the top cover 10 and the chip housing section 6 shown in FIG. 1A.

In the present embodiment, the acceleration sensor chip 4 is sealed in the package 1 using the chip housing section 6 and the top cover 10. Sealing in some way like this is preferable to improve the detection accuracy of the acceleration sensor chip 4, but it should be noted that the sealing is not always required for the present invention. In other words, the top cover 10 is not always necessary.

Figure 1B:
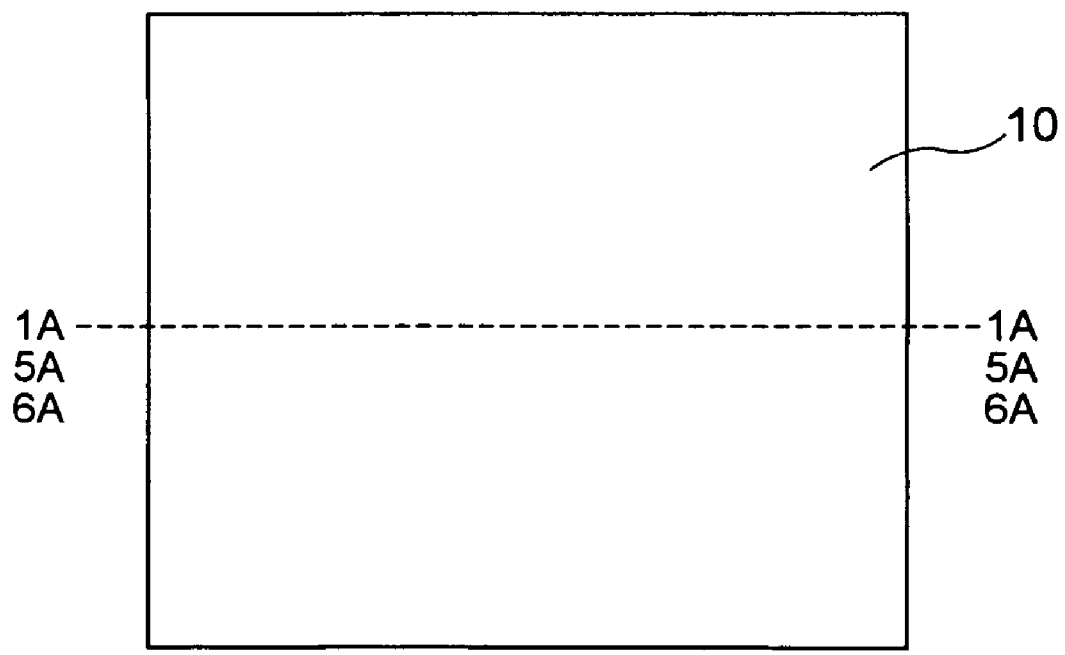
FIG. 1B is a plan view of the semiconductor acceleration sensor device shown in FIG. 1A.

As FIG. 1B shows, the cop cover 10 constitutes a part of the package 1. The shape of the top cover 10 (that is the shape of the package 1) is a square, when viewed from the top, and the length of one side is 6.0 mm.

Figure 2A:
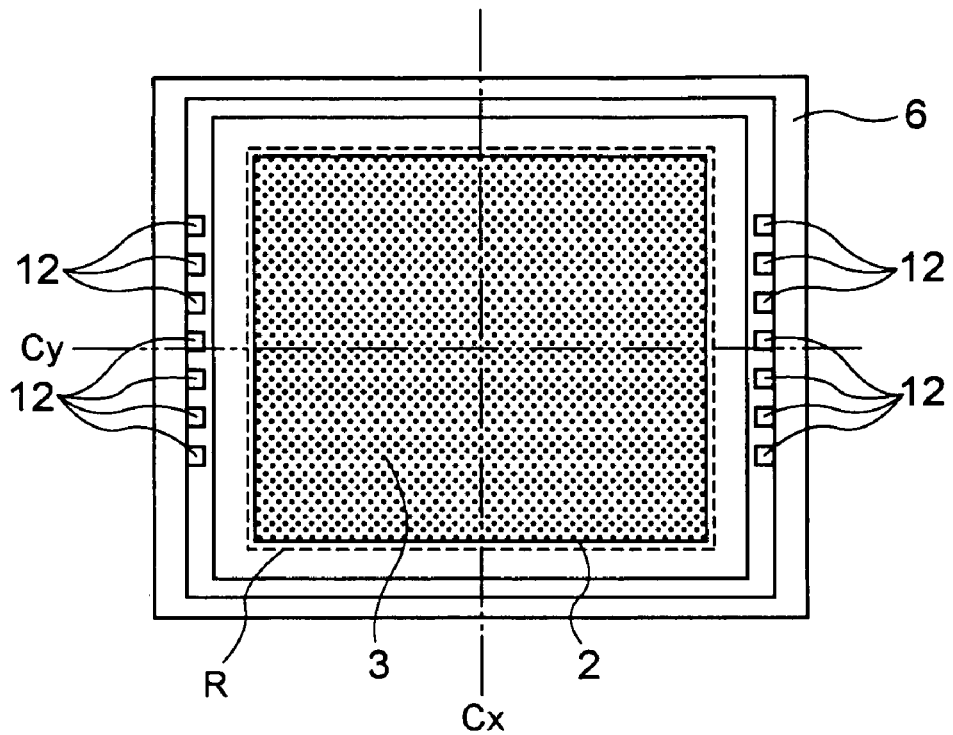
FIG. 2A is a plan view of the semiconductor acceleration sensor device according to the first embodiment when a top cover and other elements are removed.
Figure 3A:
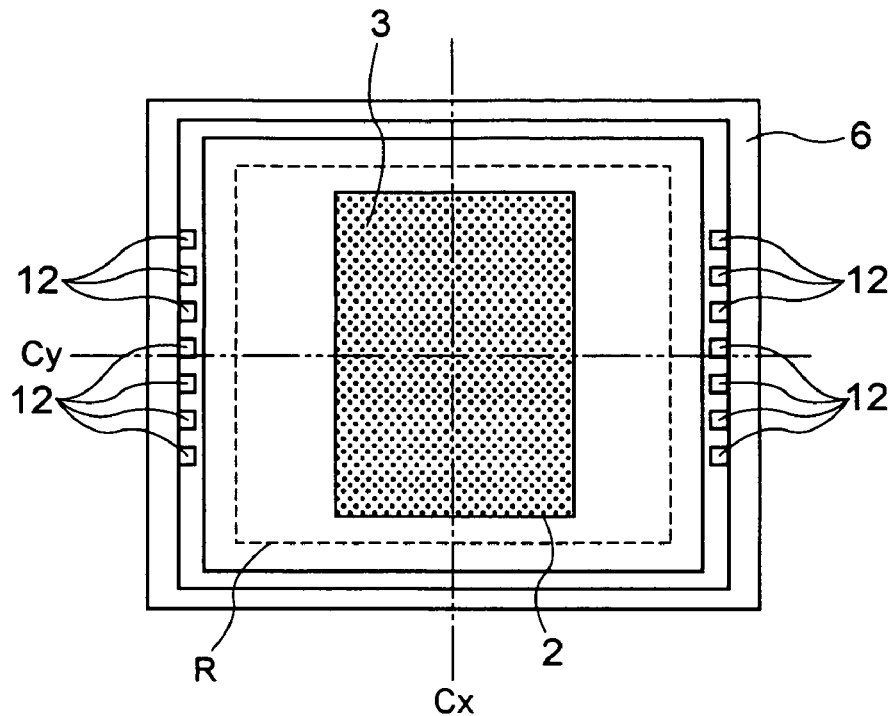
FIG. 3A is a plan view depicting another semiconductor acceleration sensor device when a different low elasticity element is used as compared with FIG. 2A.
Figure 3B:
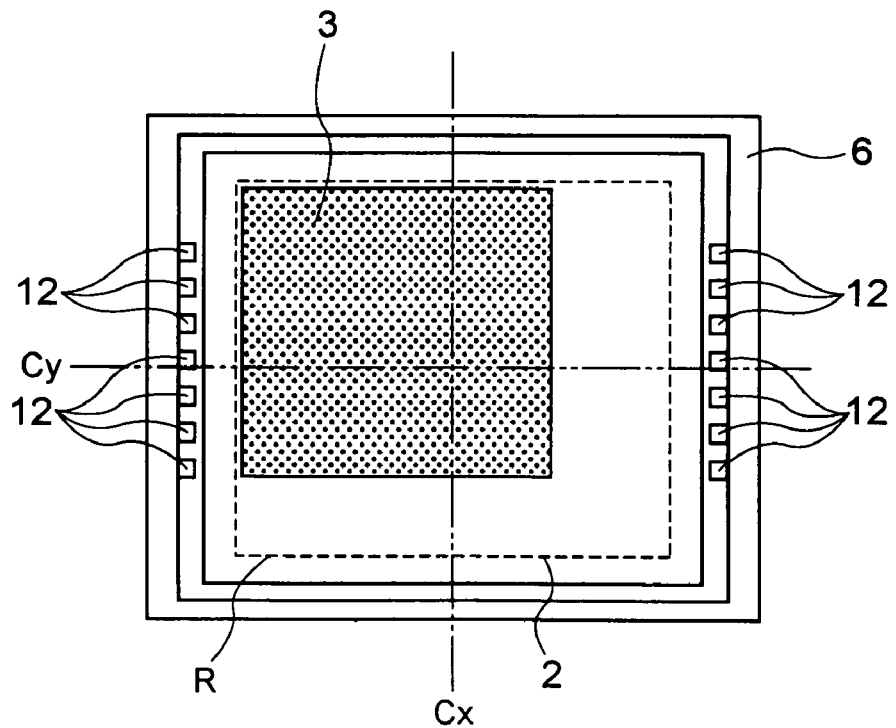
FIG. 3B is a plan view depicting still another semiconductor acceleration sensor device when a different low elasticity element is used as compared with FIG. 2A.

FIG. 2A is a plan view depicting the semiconductor acceleration sensor device when the top cover 10, adhesive 8, wires 14 and acceleration sensor chip 4 are removed from the semiconductor acceleration sensor device in FIG. 1A. In other words, FIG. 2A depicts the low elasticity element 3 filled in the concave section 2.

The concave section 2 is formed in the predetermined area R on the bottom face 5. In this embodiment, the predetermined area R has a square shape, of which one side is 1.8 mm. The shape, size and position of the concave section 2 are the same as those of the predetermined area R.

In the concave section 2, the low elasticity element 3, made of silicon rubber, is filled. Because the low elasticity element 3 fills the concave section 2, the shape of the low elasticity element 3 is defined by the side walls of the concave section 2. Therefore, the shape, size and position of the low elasticity element 3 are the same as those of the concave section 2 and the predetermined area R. Thus, the low elasticity element 3 is provided at the fixed location in the predetermined area R. The low elasticity element 3 is positioned so as to be symmetric with respect to the center line Cx of the area R in the x axis direction, and also be symmetric with respect to the center line Cy of the area R in the y axis direction. In other words, because the shape, size and position of the low elasticity element 3 are the same as those of the predetermined area R, naturally the low elasticity element 3 is positioned to be symmetric with respect to both the center lines Cx and Cy. However, in the case of the low elasticity element 3 of which the shape is rectangular and the size is smaller than that of the predetermined area R, as shown in FIG. 3A, for example, the low elasticity element 3 is positioned to be symmetric with respect to both the center lines Cx and Cy only when it is positioned as FIG. 3A. If the low elasticity element 3 of which the shape is square and the size is smaller than that of the predetermined area R, is positioned as shown in FIG. 3B, for example, then the low elasticity element 3 is not positioned to be symmetric with respect to both the center lines Cx and Cy. In fact, the low elasticity element 3 is symmetric with respect to neither the center line Cx nor the center line Cy in FIG. 3B.

Figure 2B:
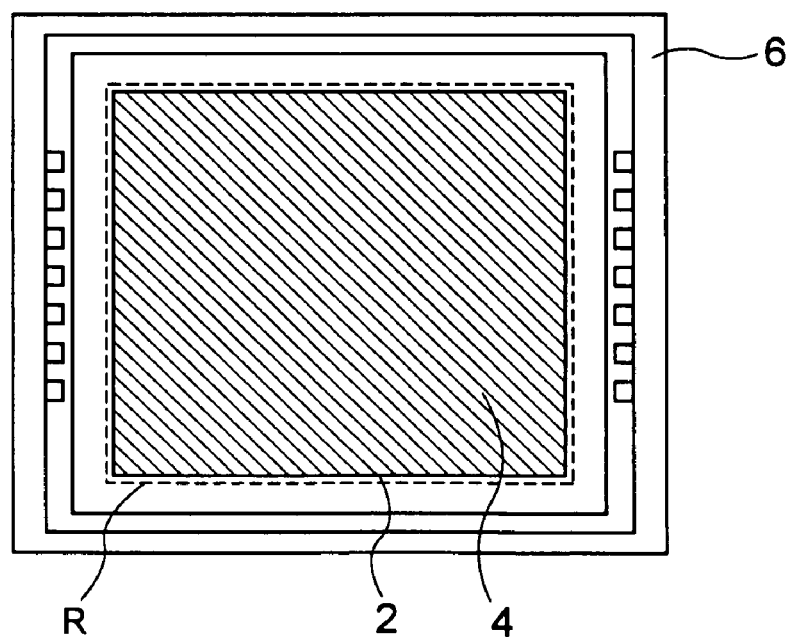
FIG. 2B is another plan view of the semiconductor acceleration sensor device according to the first embodiment when an acceleration sensor chip is placed on an elastic element.

FIG. 2B is a plan view when the acceleration sensor chip 4 is mounted on the low elasticity element 3 shown in FIG. 2A.

As FIG. 2B shows, the acceleration sensor chip 4 is mounted on the low elasticity element 3. In other words, according to this embodiment, the shape, size and position of the acceleration sensor chip 4 are the same as those of the predetermined area R. Therefore, in FIG. 2B, the acceleration sensor chip 4 is positioned to cover the concave section 2 and the low elasticity element 3 completely.

In FIG. 2A and FIG. 2B, the broken line indicating the predetermined area R is slightly outside the concave section 2, the low elasticity element 3 and the acceleration sensor chip 4, but this is merely to identify this line. The shapes, sizes and positions of the area R, concave section 2, low elasticity element 3 and sensor chip 4 in the present embodiment are the same.

The semiconductor acceleration sensor device of the first embodiment has five advantages.

The low elasticity element 3 having adhesiveness is filled in the concave section 2, and is partitioned by the side walls of the concave section 2. Therefore, a dimensional change of the low elasticity element 3 when the ambient temperature is changed is generated mainly in the vertical direction, and a dimensional change in the horizontal direction is suppressed. Accordingly, the stress to be applied to the acceleration sensor chip 4 adhered to the low elasticity element 3 can be decreased. Since the distortion generated in the acceleration sensor chip 4 due to temperature change is suppressed, the detection accuracy of the acceleration sensor can be improved. This is the first advantage. In the first embodiment, the low elasticity element 3 is filled in the concave section 2, but is not formed on the bottom face 5 where the concave section 2 does not exist. In other words, the shape, size and position of the low elasticity element 3 are the same as those of the concave section 2. It should be noted, however, that even if the low elasticity element 3 is filled in the concave section 2 and is also formed on the bottom face 5 where the concave section 2 does not exist, the dimensional change of the low elasticity element 3 in the horizontal direction can be suppressed as compared with the prior art, because at least some part of the low elasticity element 3 is partitioned by the side walls of the concave section 2.

The low elasticity element 3 is square, that is a rectangle, so that the concave section 2 is also rectangle. The concave sections 2 are molded when the chip housing section 6 is molded by stacking the shaped ceramic sheets. Therefore, the design is easier than the case of using a shape other than a rectangle (e.g., circle). This is the second advantage.

The shape, size and position of the acceleration sensor chip 4 are the same as those of the predetermined area R, and the shape of the low elasticity element 3 in the predetermined area R is symmetric with respect to both the center lines Cx and Cy of the predetermined area R in the x axis direction and the y axis direction respectively. Thus, the stress to be applied from the low elasticity element 3 to the acceleration sensor chip 4, when the ambient temperature is changed, can be evenly distributed. This is the third advantage. Because the square low elasticity element 3 is formed in the same square-shaped area R, the low elasticity element 3 naturally becomes symmetric with respect to both the center lines Cx and Cy. It should be noted, however, that this third advantage can also be obtained in the case of FIG. 3A. This advantage cannot be achieved when the low elasticity element 3 is not symmetric with respect to both the center lines Cx and Cy, like the case of FIG. 3B.

The shape, size and position of the acceleration sensor chip 4 are the same as those of the predetermined area R, and the shape, size and position of the low elasticity element 3 are also the same as those of the predetermined area R. Thus, the acceleration sensor chip 4 completely covers the low elasticity element 3. In other words, virtually the entire bottom face of the acceleration sensor chip 4 is adhered to the low elasticity element 3. Therefore, the acceleration sensor chip 4 can be stably mounted on the package 1. This is the fourth advantage. That the entire bottom face is "virtually" adhered (i.e., the presence of some clearance, not adhering with the acceleration sensor chip 4 in the edge of the top face of the low elasticity element 3) is acceptable, as mentioned above.

The shape of the low elasticity element 3 is square. When compared with the case of a rectangle, stress to be applied from the square low elasticity element 3 to the acceleration sensor chip 4 upon changes of the ambient temperature is more evenly distributed. Not only is the low elasticity element 3 square, but the shapes of the area R and the acceleration sensor chip 4 are both square, and the sizes and positions of the area R and acceleration sensor chip 4 are also the same. Therefore, when compared with the case where the shapes, sizes and positions of the low elasticity element 3, sensor chip 4 and area R are not all the same, the stress is more evenly applied from the low elasticity element 3 to the acceleration sensor chip 4 upon the ambient temperature change. This is the fifth advantage.

Now the fabrication method of the semiconductor acceleration sensor device according to the first embodiment of the present invention will be described with reference to FIG. 4A through FIG. 4E. In the following description of the fabrication method, the already described structure will not be described repeatedly.

First, as FIG. 4A shows, the acceleration sensor chip 4 fabricated by a known method is prepared. The acceleration sensor chip 4 is designed to produce electric signals according to the magnitude and direction of the applied acceleration.

Then the chip housing section 6 having the recess section 2 in the predetermined area R of the bottom face 5 is prepared, as shown in FIG. 4B and FIG. 4B'. The material of the chip housing section 6 is ceramic, and is molded by stacking shaped ceramic sheets. At this time, the recess section 2 is formed on the bottom face 5 inside the chip housing section 6. The chip housing section 6 has a plurality of package electrodes 12. In FIG. 4B', the broken line to indicate the predetermined area R is drawn slightly outside the recess section 2, but this is merely to identify the broken line, and the shape, size and position of the area R are the same as those of the recess section 2.

Then as FIG. 4C shows, the silicon rubber (low elasticity element 3) liquefied at high temperature is poured into the concave section 2 so that the concave section 2 is filled with the low elasticity element 3. At this time, the surface of the low elasticity element 3 slightly rises because of surface tension, and the vertex portion thereof is about several tens μm higher than the bottom face 5 of the chip housing section 6. Preferably, the vertex of the low elasticity element 3 is 30 μm to 40 μm higher than the bottom face 5.

Then as FIG. 4D shows, the acceleration sensor chip 4 is mounted on the low elasticity element 3 while the low elasticity element 3 is liquid, and the low elasticity element 3 is cooled and solidified. As a result, the chip housing section 6, low elasticity element 3 and acceleration sensor chip 4 are adhered. At this time, the adhesive surface between the low elasticity element 3 and acceleration sensor chip 4 is about 10 μm higher than the bottom face 5.

Then as FIG. 4E shows, the electrodes (not illustrated) of the acceleration sensor chip 4 and the package electrodes 12 are connected with each other by wires 14, and the top cover 10, made of ceramic, is put over the chip housing section 6 with adhesive 8. In this way, the acceleration sensor chip 4 is sealed by the package 1 which includes the chip housing section 6 and the top cover 10, and the fabrication of the semiconductor acceleration sensor device is completed.

The fabrication method of the semiconductor acceleration sensor device of the first embodiment has two advantages.

Because the low elasticity element 3 is formed by pouring the liquid low elasticity element 3 into the concave section 2 after the concave section 2 is molded on the bottom face 5 in advance, the low elasticity element 3 can be formed accurately. This is the first advantage.

The second advantage is that the acceleration sensor chip 4 can be mounted accurately because the acceleration sensor chip 4, of which shape and size are the same as those of the concave section 2 and the low elasticity element 3, is mounted on the low elasticity element 3 at the same position as the concave section 2 and the low elasticity element 3.

Modifications

Now, two modifications to the first embodiment will be described below.

A first modified example of the structure and fabrication method of the semiconductor acceleration sensor according to the first embodiment of the present invention will now be described with reference to FIG. 5A through FIG. 5C as well as FIG. 4A through FIG. 4E. Description of the first modified example that is the same as the structure and fabrication method of the semiconductor acceleration sensor device of the first embodiment will be omitted.

Figure 5A:
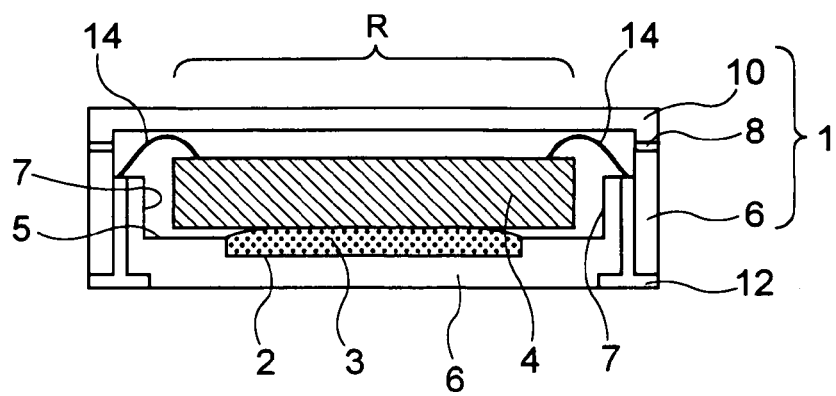
Figure 5B:
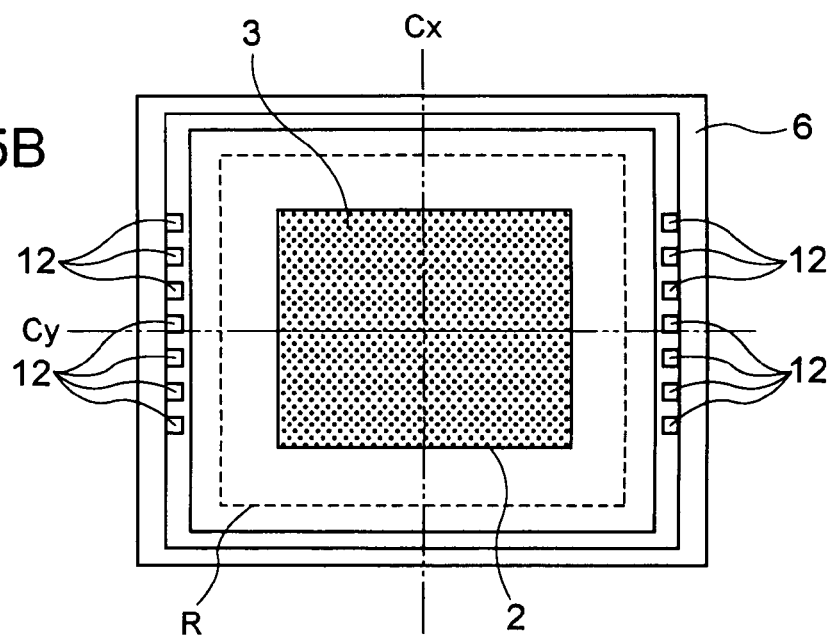
Figure 5C:
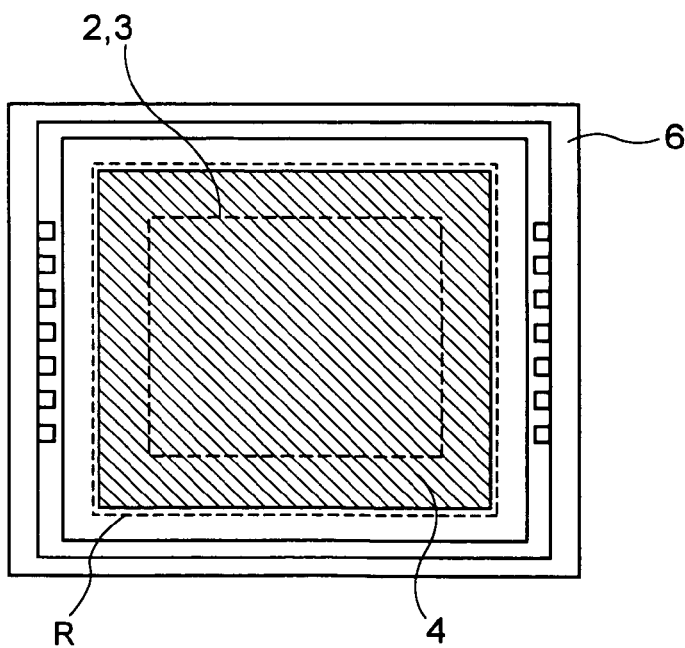

FIG. 5A is a cross-sectional view depicting the semiconductor acceleration sensor device of the first modified example, taken along the line 5A-5A in FIG. 1B. FIG. 5B is a plan view depicting the semiconductor acceleration sensor device of the first modified example when the top cover 10, adhesive 8, wires 14 and acceleration sensor chip 4 are removed. FIG. 5C is a plan view depicting the acceleration sensor chip 4 mounted on the low elasticity element 3 in FIG. 5B.

The structure of the semiconductor acceleration sensor device of the first modified example is different from the semiconductor acceleration sensor device of the first embodiment in the sizes of the concave section 2 and low elasticity element 3. Specifically, the sizes of the concave section 2 and the low elasticity element 3 are smaller than those of the first embodiment. In other words, the sizes of the concave section 2 and the low elasticity element 3 are smaller than the acceleration sensor chip 4. The size of the acceleration sensor chip 4 is the same as that of the predetermined area R, just like the first embodiment. The rest is the same as the first embodiment.

The semiconductor acceleration sensor device of the first modified example can also obtain the first to third advantages, just like the advantages of the semiconductor acceleration sensor device of the first embodiment. Specifically, the semiconductor acceleration sensor device of the first modified example has the following three advantages. The first advantage is that the low elasticity element 3 is partitioned by the side walls of the concave section 2, so that a dimensional change of the low elasticity element 3 in the horizontal direction when the ambient temperature is changed can be suppressed. The second advantage is that the low elasticity element 3 is a rectangle, so that design is easier than the case of a shape other than a rectangle. The third advantage is that the shape, size and position of the acceleration sensor chip 4 are the same as those of the predetermined area R, and the shape of the low elasticity element 3 in the predetermined area R is symmetric with respect to both the center lines Cx and Cy of the predetermined area R in the x axis direction and the y axis direction, so that the stress to be applied from the low elasticity element 3 to the acceleration sensor chip 4 when the ambient temperature changes can be evenly distributed.

The first modified example can also provide the following advantage. Because the size of the low elasticity element 3 is smaller than that of the low elasticity element 3 of the first embodiment, the dimensional change of the low elasticity element 3 when the ambient temperature changes is smaller than the first embodiment, and the stress to be applied to the acceleration sensor chip 4 adhered on the low elasticity element 3 can be decreased even more than the first embodiment. Therefore, the distortion generated in the acceleration sensor chip 4 by the temperature change can be suppressed even more. Accordingly, the detection accuracy of the acceleration sensor can be improved.

The fabrication method of the semiconductor acceleration sensor device of the first modified example is different from the fabrication method of the first embodiment in the preparation of the concave portion 2. Specifically, the concave section 2 is molded to be the size shown in FIG. 5A and FIG. 5B in the fabrication step of FIG. 4B and FIG. 4B'. Therefore, the low elasticity element 3 filled in the concave section 2 also becomes that as shown in FIG. 5A and FIG. 5B. The rest is the same as the fabrication method of the semiconductor acceleration sensor device of the first embodiment shown in FIG. 4A to FIG. 4E.

The fabrication method of the semiconductor acceleration sensor device of the first modified has a similar advantage to the fabrication method of the semiconductor acceleration sensor device of the first embodiment. Specifically, because the low elasticity element 3 is formed by filling the liquid low elasticity element 3 into the concave section 2 after the concave section 2 is molded on the bottom face 5 in advance, the low elasticity element 3 can be accurately formed.

The second modified example to the structure and fabrication method of the semiconductor acceleration sensor device according to the first embodiment of the present invention will now be described with reference to FIG. 6A through FIG. 6C and FIG. 4A through FIG. 4E. Description of the second modified example that is the same as the structure and fabrication method of the semiconductor acceleration sensor device according to the first embodiment will be omitted.

Figure 6A:
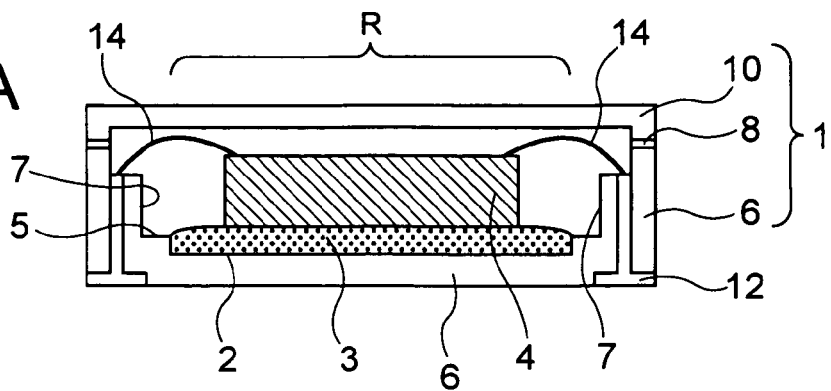
Figure 6B:
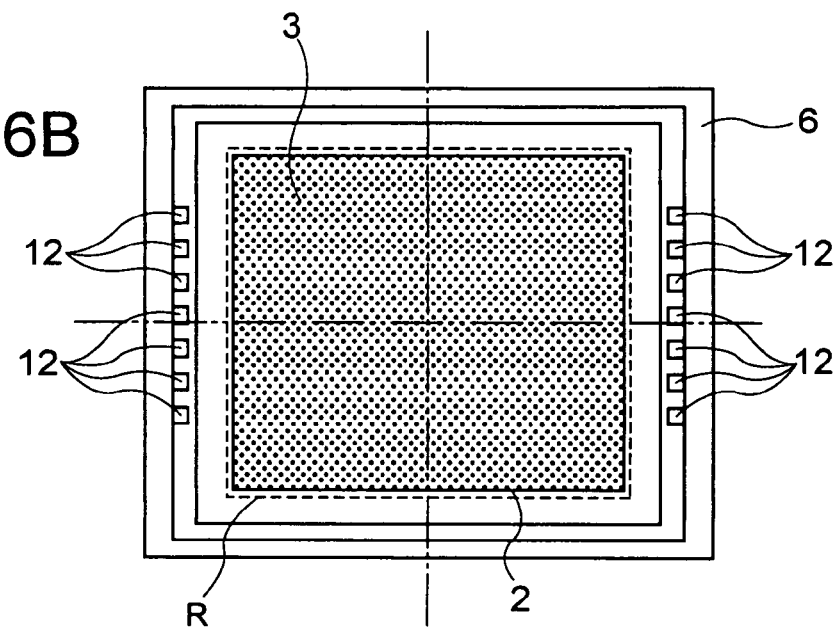
Figure 6C:
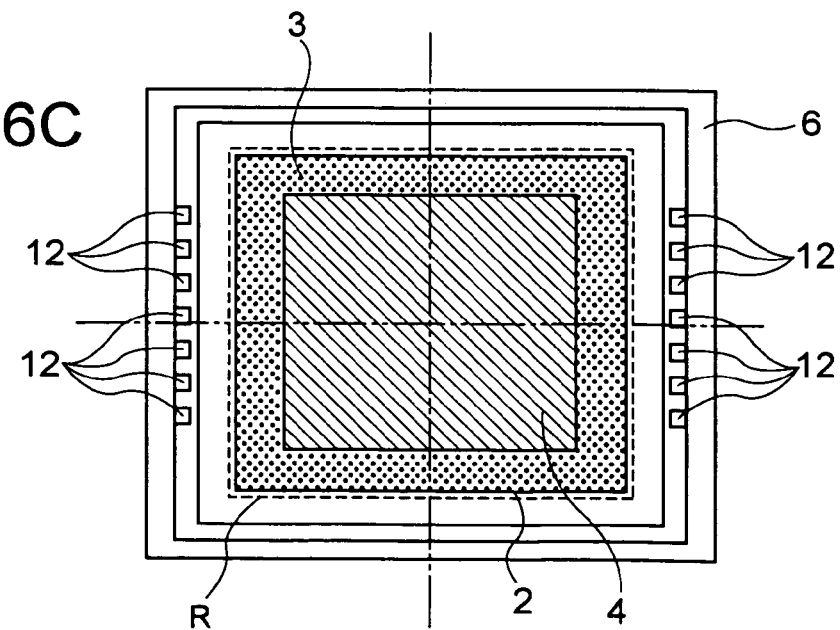

FIG. 6A is a cross-sectional view of the semiconductor acceleration sensor device of the second modified example, taken along the line 6A-6A in FIG. 1B. FIG. 6B is a plan view of the semiconductor acceleration sensor device of the second modified example when the top cover 10, adhesive 8, wires 14 and acceleration sensor chip 4 are removed. FIG. 6C is a plan view depicting the acceleration sensor chip 4 mounted on the low elasticity element 3 in FIG. 6B.

The structure of the semiconductor acceleration sensor device of the second modified example is different from the semiconductor acceleration sensor device of the first embodiment in the size of the acceleration sensor chip 4. Specifically, the acceleration sensor chip 4 is smaller than the first embodiment. In other words, the size of the acceleration sensor chip 4 is smaller than the size of the low elasticity element 3. The size of the low elasticity element 3 is the same as that of the predetermined area R, just like the first embodiment. In this modification, as shown in FIG. 6C, the acceleration sensor chip 4 is positioned in the predetermined area R so as to be symmetric with respect to the center line Cx of the area R in the x axis direction, and the center line Cy of the area R in the y axis direction. When the acceleration sensor chip 4 is mounted in the predetermined area R (that is, the area where the low elasticity element 3 is formed), the adhesive surface between the low elasticity element 3 and the acceleration sensor chip 4 need not be higher than the bottom face 5. This is because there is no concern that the acceleration sensor chip 4 will hit the bottom face 5 when shock is applied to the package 1 from the outside. The rest is the same as the first embodiment.

The semiconductor acceleration sensor device of the second modified example has two advantages similar to the semiconductor acceleration sensor device of the first embodiment. The first advantage is that the low elasticity element 3 is partitioned by the side walls of the concave section 2, so that the dimensional change of the low elasticity element 3 in the horizontal direction when the ambient temperature changes can be suppressed. The second advantage is that the low elasticity element 3 is a rectangle, so that design is easier than the case of a shape other than a rectangle.

The second modified example can also provide the following advantages. The third advantage is that the entire back face of the acceleration sensor chip 4 adheres to the low elasticity element 3, so that the acceleration sensor chip 4 can be stably mounted on the package 1. The fourth advantage is that the acceleration sensor chip 4 is positioned in the predetermined area R so that the shape thereof is symmetric with respect to the center line Cx in the x axis direction and the center line Cy in the y axis direction. Accordingly, the stress to be applied from the low elasticity element 3 to the acceleration sensor chip 4 when the ambient temperature changes can be evenly distributed.

The fabrication method of the semiconductor acceleration sensor device of the second modified example is different from the fabrication method of the first embodiment in the preparation of the acceleration sensor 4. Specifically, the acceleration sensor chip 4 is molded to be the size shown in FIG. 6A and FIG. 6C in the fabrication step of FIG. 4B and FIG. 4B'. Another difference lies in that the acceleration sensor chip 4 is mounted at the position shown in FIG. 6A and FIG. 6C in the fabrication step of FIG. 4D. The rest is the same as the fabrication method of the semiconductor acceleration sensor device of the first embodiment shown in FIG. 4A to FIG. 4E.

The fabrication method of the semiconductor acceleration sensor device of the second modified example can provide a similar advantage to the fabrication method of the semiconductor acceleration sensor device of the first embodiment. Specifically, the low elasticity element 3 is formed by filling the liquid low elasticity element 3 into the concave section 2 made in the bottom face 5 in advance, so that the low elasticity element 3 can be accurately formed.

The second modified example also has the following advantage. Even if the acceleration sensor chip 4 is not mounted at a desired position (e.g., position in FIG. 6C) accurately, it is highly possible that the acceleration sensor chip 4 is mounted at a stable position where the entire bottom face thereof is adhered to the low elasticity element 3.

Second Embodiment

The structure and fabrication method of the semiconductor acceleration sensor device according to the second embodiment of the present invention will now be described with reference to FIG. 7A through FIG. 9B and FIG. 4A through FIG. 4E. Description of the second embodiment which is the same as that of the structure and fabrication method of the semiconductor acceleration sensor device according to the first embodiment will be omitted.

Figure 7A:
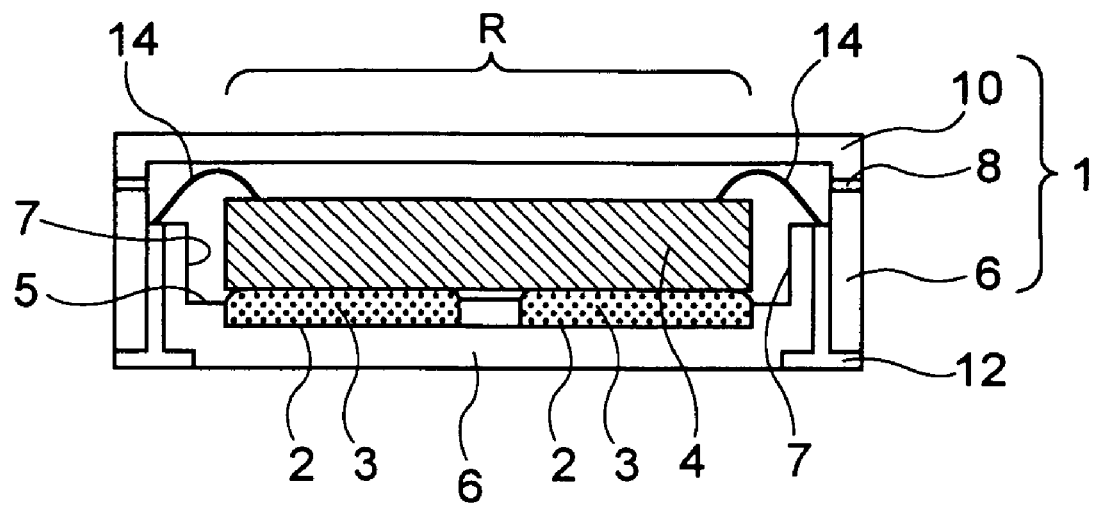
FIG. 7A is a cross-sectional view of a semiconductor acceleration sensor device according to the second embodiment, taken along the line 7A-7A in FIG. 7B.
Figure 7B:
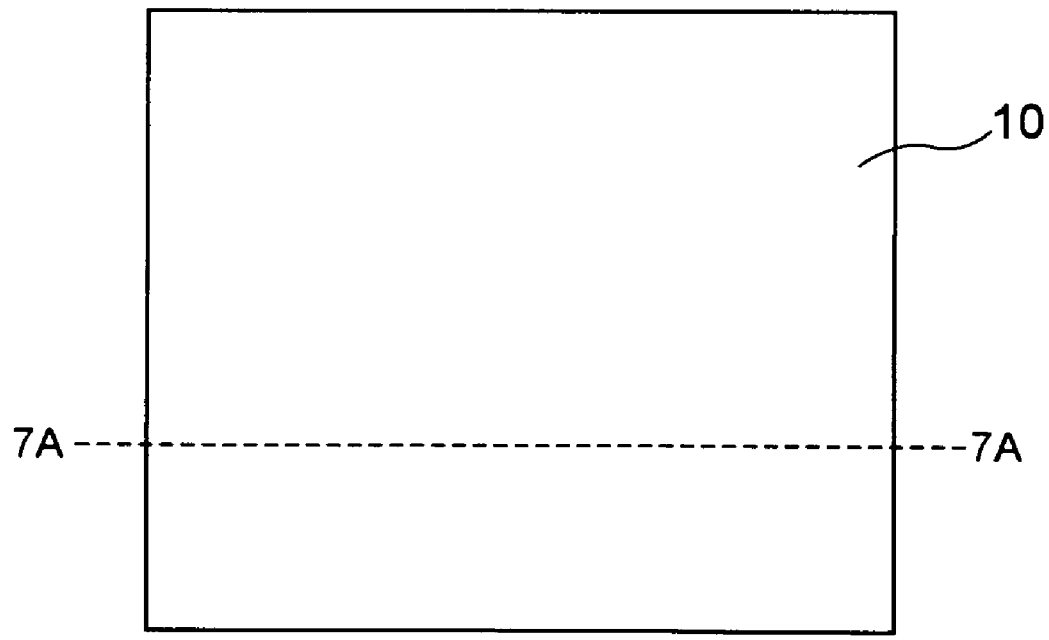
FIG. 7B is a plan view of the semiconductor acceleration sensor device shown in FIG. 7A.
Figure 8A:
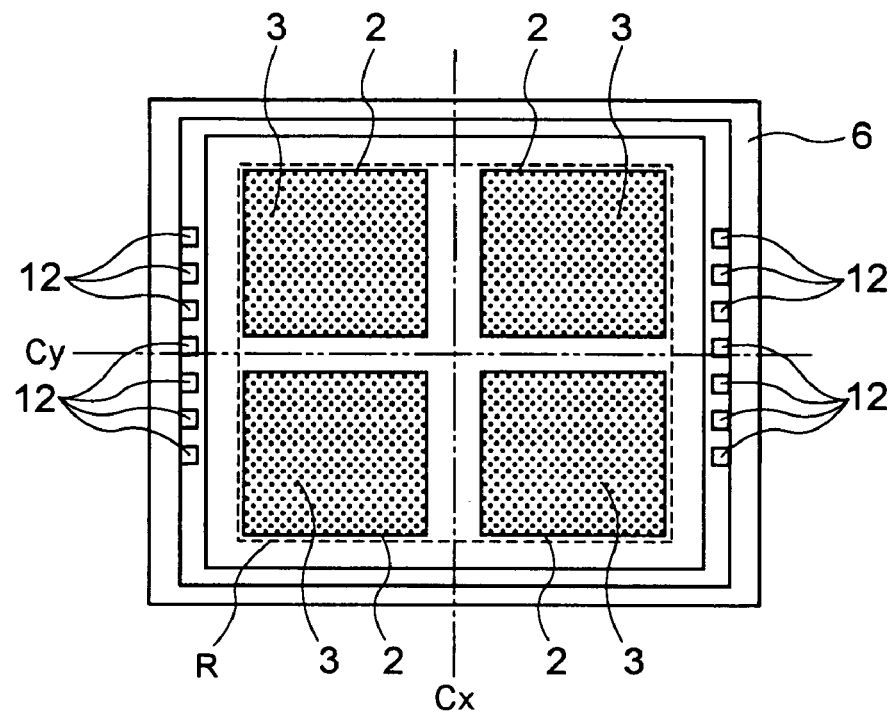
FIG. 8A is a plan view depicting the structure of the semiconductor acceleration sensor device according to the second embodiment when a top cover and other elements are removed.
Figure 8B:
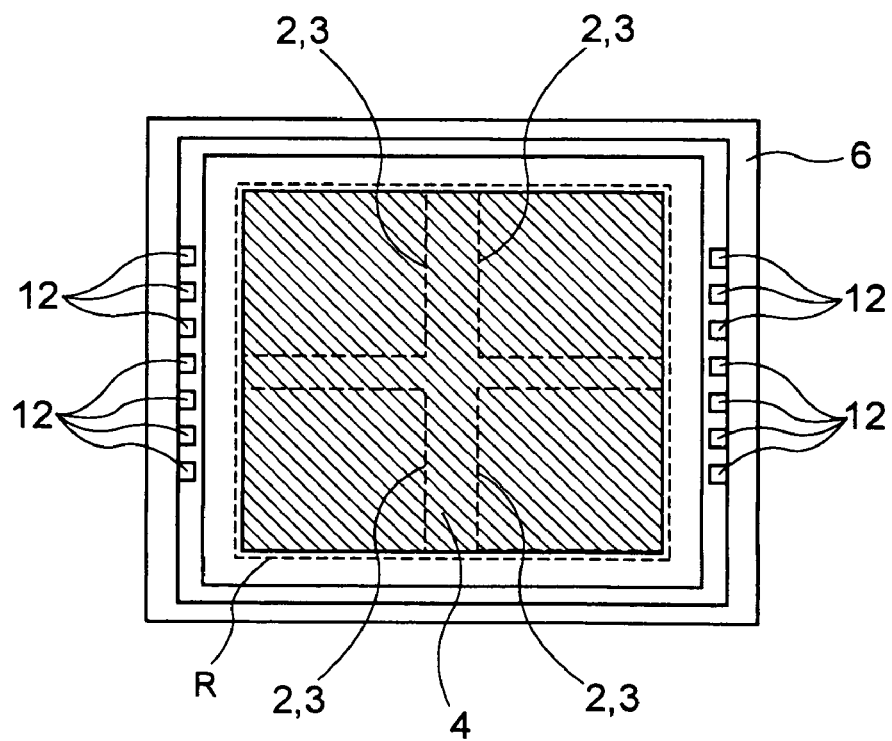
FIG. 8B is another plan view of the semiconductor acceleration sensor device according to the second embodiment.
Figure 9A:
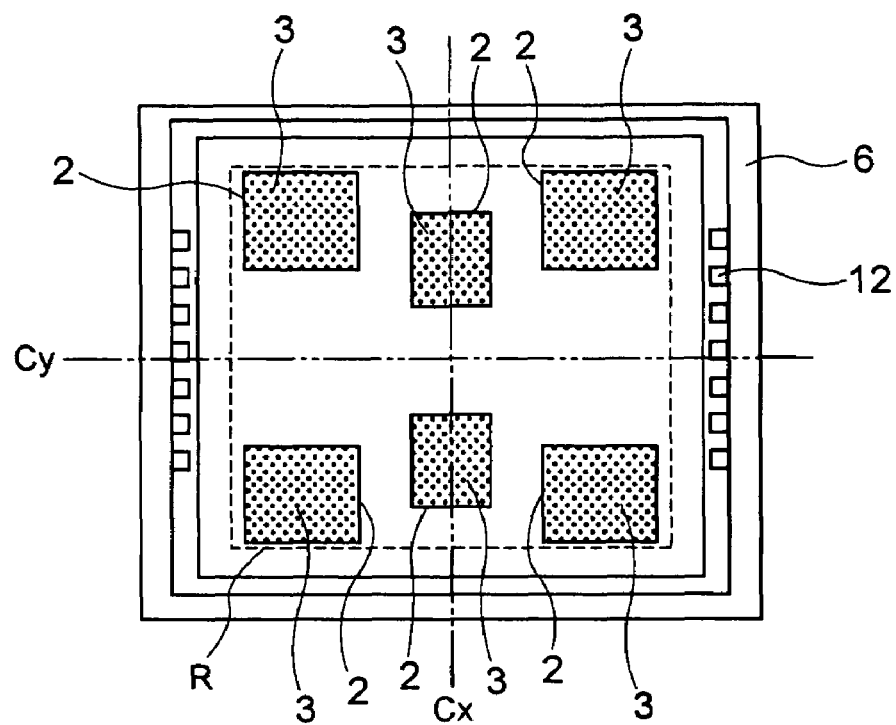
FIG. 9A is a plan view of another semiconductor acceleration sensor device when different low elasticity elements are used as compared with the low elasticity elements shown in FIG. 8A.
Figure 9B:
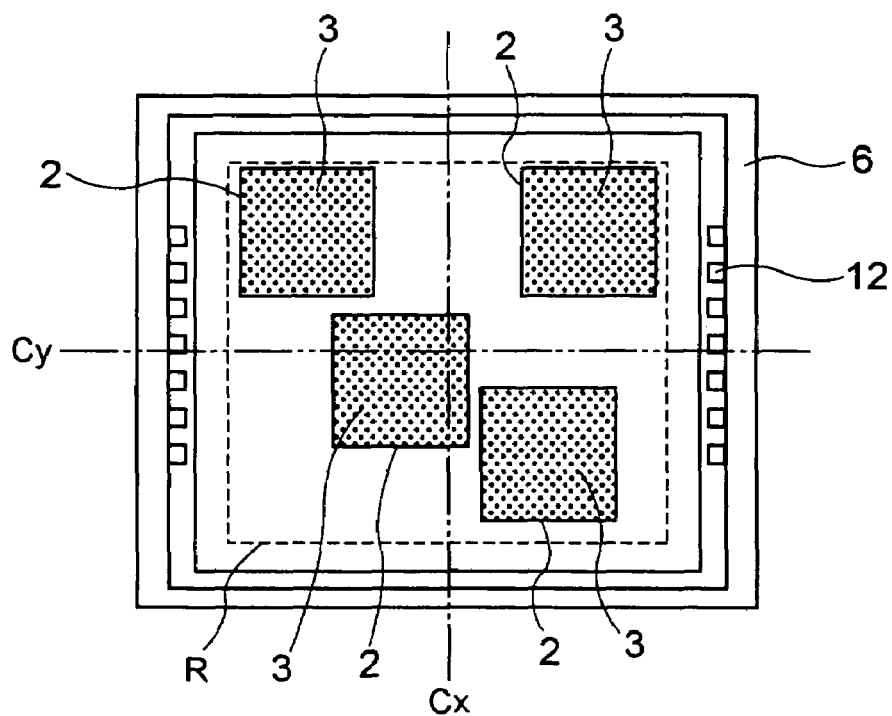
FIG. 9B is a plan view of still another semiconductor acceleration sensor device when different low elasticity elements are used as compared with the low elasticity elements shown in FIG. 8A.

FIG. 7B is a plan view of the semiconductor acceleration sensor device of the second embodiment. FIG. 7A is a cross-sectional view of the semiconductor acceleration sensor device of the second embodiment, taken along the line 7A-7A in FIG. 7B. FIG. 8A is a plan view depicting the semiconductor acceleration sensor device of the second embodiment when the top cover 10, adhesive 8, wires 14 and acceleration sensor chip 4 are removed. FIG. 8B is a plan view depicting the acceleration sensor chip 4 mounted on the low elasticity element 3 in FIG. 8A. FIG. 9A is an example when the shape, size and/or position of the low elasticity element 3 is different from that of the low elasticity element 3 of the FIG. 7B embodiment. FIG. 9B is another example when the shape, size and/or position of the low elasticity element 3 is different from that of the low elasticity element 3 of the FIG. 7B embodiment. The structure of the semiconductor acceleration sensor device of the second embodiment is different from the semiconductor acceleration sensor device of the first embodiment in the low elasticity element 3. Specifically, the low elasticity element 3 is partitioned into four pieces in the predetermined area R.

As shown in FIG. 7A and FIG. 8A, the concave section 2 is partitioned into four sections in the predetermined area R on the bottom face 5. The low elasticity elements 3 are formed so as to fill the four concave sections 2 respectively, and are partitioned by the side walls of the respective concave sections 2. Therefore, the shape, size and position of the low elasticity element 3 are the same as those of the corresponding concave section 2. Each low elasticity element 3 is a square of which one side is 0.8 mm. The spacing between the adjacent low elasticity elements 3 is 0.2 mm. The four low elasticity elements 3 are positioned so as to contact the four vertexes (corners) of the area R respectively. The four low elasticity elements 3 are positioned in the area R so as to be symmetric with respect to the center line Cx of the predetermined area R in the x axis direction, and also to be symmetric with respect to the center line Cy of the area R in the y axis direction. In other words, the four low elasticity elements 3, of which shape and size are all the same, are positioned to contact the four corners of the area R respectively. Thus, the low elasticity elements are naturally positioned to be symmetric with respect to both the center lines Cx and Cy. If the low elasticity element 3 is divided into six pieces and the six low elasticity elements 3 have different shapes and sizes, the six low elasticity elements can be positioned to be symmetric with respect to both the center lines Cx and Cy as shown in FIG. 9A. It should be noted that even if the four low elasticity elements 3 are square and have the same size, they may not be positioned to be symmetric with respect to both the center lines Cx and Cy as shown in FIG. 9B. In FIG. 9B, the four low elasticity elements are not symmetric with respect to the center line Cx and not symmetric with respect to the center line Cy.

As shown in FIG. 7A and FIG. 8B, the single acceleration sensor chip 4 is mounted over the four low elasticity elements 3. The shape, size and position of the acceleration sensor chip 4 are the same as those of the predetermined area R. Therefore, in FIG. 8B, the acceleration sensor chip 4 is positioned so as to cover the four concave section 2 and the four low elasticity elements 3 completely.

The semiconductor acceleration sensor device of the second embodiment has three advantages similar to the first embodiment. The first advantage is that the four low elasticity elements 3 are partitioned by the side walls of the associated concave sections 2 respectively, so that the dimensional change of the low elasticity elements 3 in the horizontal direction when the ambient temperature changes can be suppressed. The second advantage is that the low elasticity elements 3 are rectangles, so that design is easier than the case of a shape other than a rectangle. The third advantage is that the shape, size and position of the acceleration sensor chip 4 are the same as those of the predetermined area R, and the low elasticity elements 3 in the predetermined area R are symmetric with respect to both the center lines Cx and Cy of the predetermined area R in the x axis direction and the y axis direction. Therefore, the stress to be applied from the low elasticity elements 3 to the acceleration sensor chip 4 when the ambient temperature changes can be evenly distributed.

The second embodiment can also provide the following advantages. The fourth advantage is that because a plurality of low elasticity elements 3 are formed in the predetermined area R, each low elasticity element 3 is smaller than the low elasticity element 3 of the first embodiment. The dimensional change of the low elasticity element 3 when the ambient temperature changes is smaller as the size of the low elasticity element 3 is smaller. Thus, the stress to be applied to the acceleration sensor chip 4 adhered to the low elasticity elements 3 can be decreased even more than the first embodiment. Therefore, the distortion generated in the acceleration sensor chip 4 due to the temperature change is suppressed more. Accordingly, the detection accuracy of the acceleration sensor can be improved. The fifth advantage is that the shape, size and position of the acceleration sensor chip 4 are the same as those of the predetermined area R. The predetermined area R and the four low elasticity elements 3 are all rectangles, and the four low elasticity elements 3 are positioned to contact the four corners of the predetermined area R respectively. Therefore, the acceleration sensor chip 4 is formed to cover the four low elasticity elements 3 completely. Because the low elasticity elements 3 exist below the four corner areas of the acceleration sensor chip 4, the acceleration sensor chip 4 can be stably mounted on the package 1. The sixth advantage is that the shapes of the four low elasticity elements 3 are square, so that the stress to be applied from the low elasticity elements 3 to the acceleration sensor chip 4 when the ambient temperature changes can be more evenly distributed than the case of a rectangle.

The fabrication method of the semiconductor acceleration sensor device of the second embodiment is different from the fabrication method of the first embodiment in the preparation of the concave sections 2. Specifically, the four concave sections 2 are molded to be the size and at the position shown in FIG. 7A and FIG. 8A in the fabrication step of FIG. 4B and FIG. 4B'. This means that the four low elasticity elements 3 filled in the concave sections 2 are also formed as shown in FIG. 7A and FIG. 8A. Except that the number, size and position of the concave sections 2 and the low elasticity elements 3 are different, the fabrication method of the second embodiment is the same as the fabrication method of the first embodiment.

The fabrication method of the semiconductor acceleration sensor device of the second embodiment has similar advantages to the fabrication method of the semiconductor acceleration sensor device of the first embodiment. Specifically, the low elasticity elements 3 are formed by filling the liquid low elasticity elements 3 into the concave sections 2 made in the bottom face 5 in advance, so that the low elasticity elements 3 can be accurately formed.

Third Embodiment

The structure and fabrication method of the semiconductor acceleration sensor device according to the third embodiment of the present invention will now be described with reference to FIG. 10A through FIG. 12B and FIG. 4A through FIG. 4E. Description of the third embodiment which is the same as that of the structure and fabrication method of the semiconductor acceleration sensor device according to the first embodiment will be omitted.

Figure 10A:
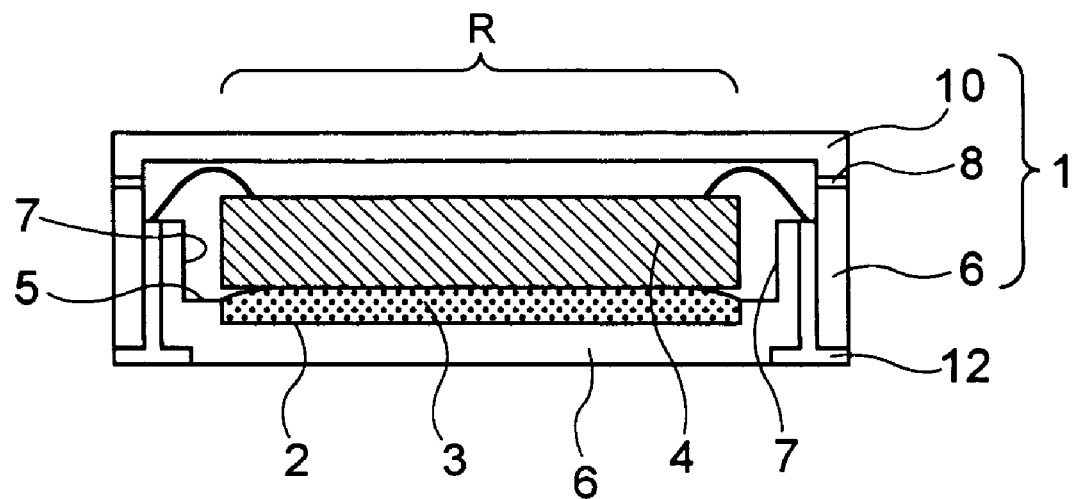
FIG. 10A is a cross-sectional view of the semiconductor acceleration sensor device according to the third embodiment, taken along the line 10A-10A in FIG. 10B.
Figure 10B:
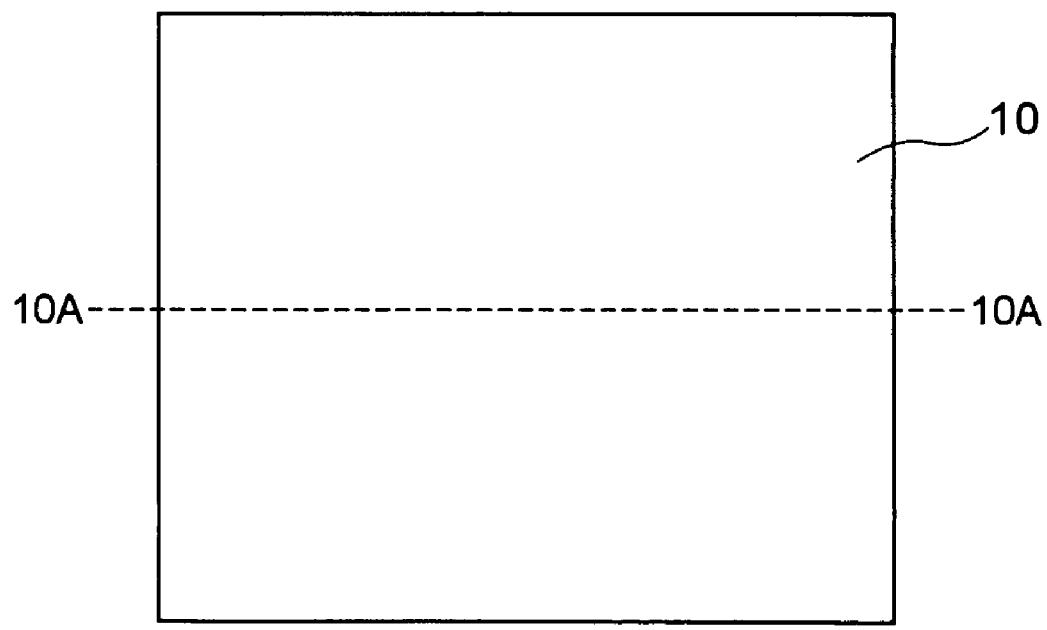
FIG. 10B is a plan view of the semiconductor acceleration sensor device according to the third embodiment.
Figure 11A:
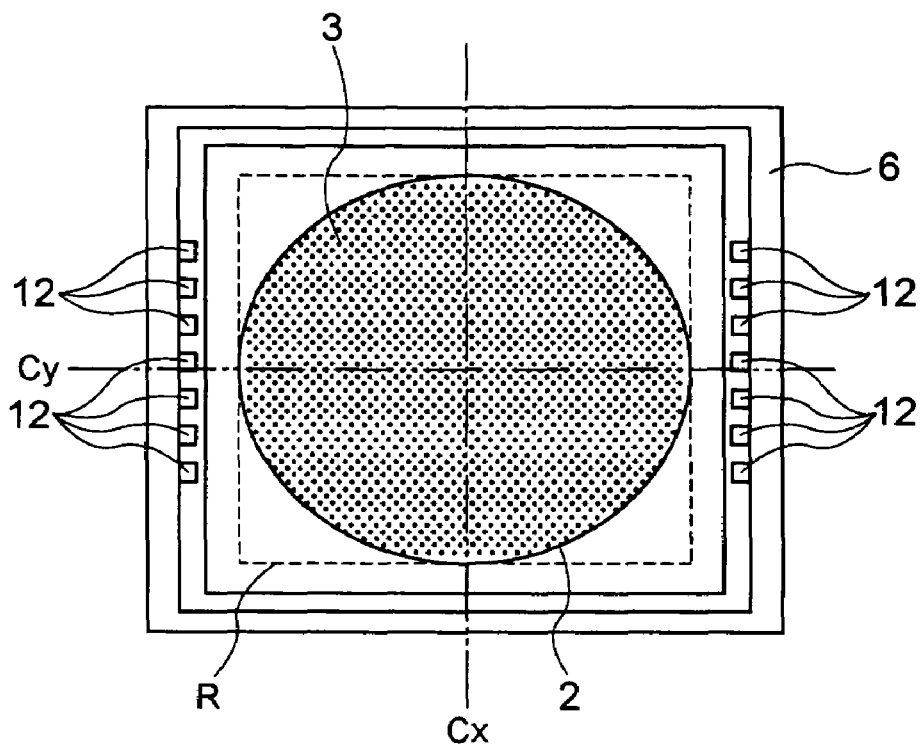
FIG. 11A is a plan view of the semiconductor acceleration sensor device according to the third embodiment when a top cover and other elements are removed.
Figure 11B:
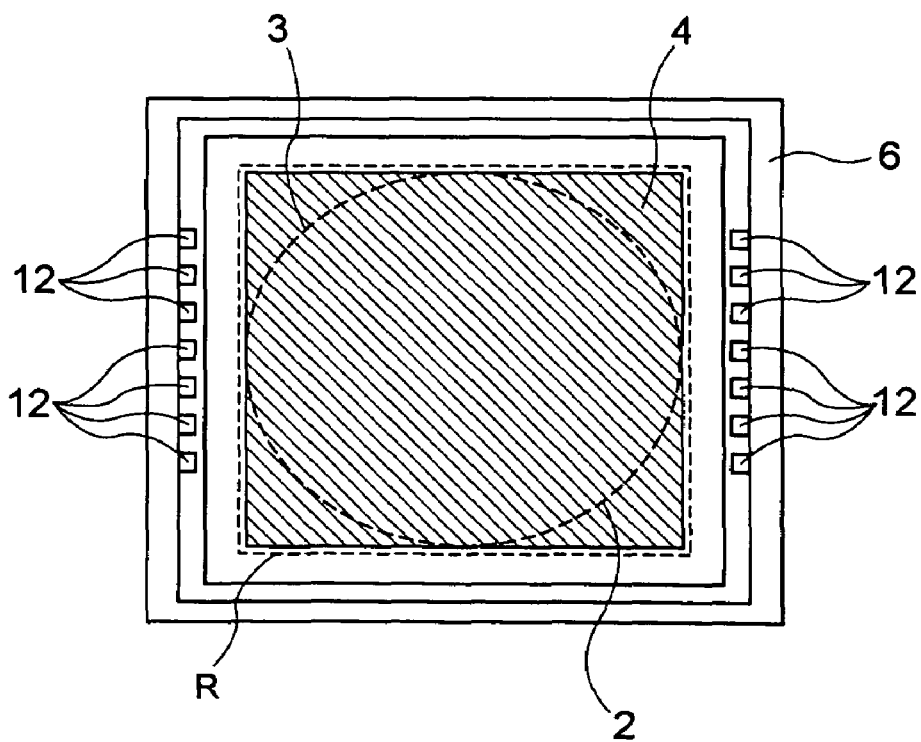
FIG. 11B is another plan view of the semiconductor acceleration sensor device according to the third embodiment.
Figure 12A:
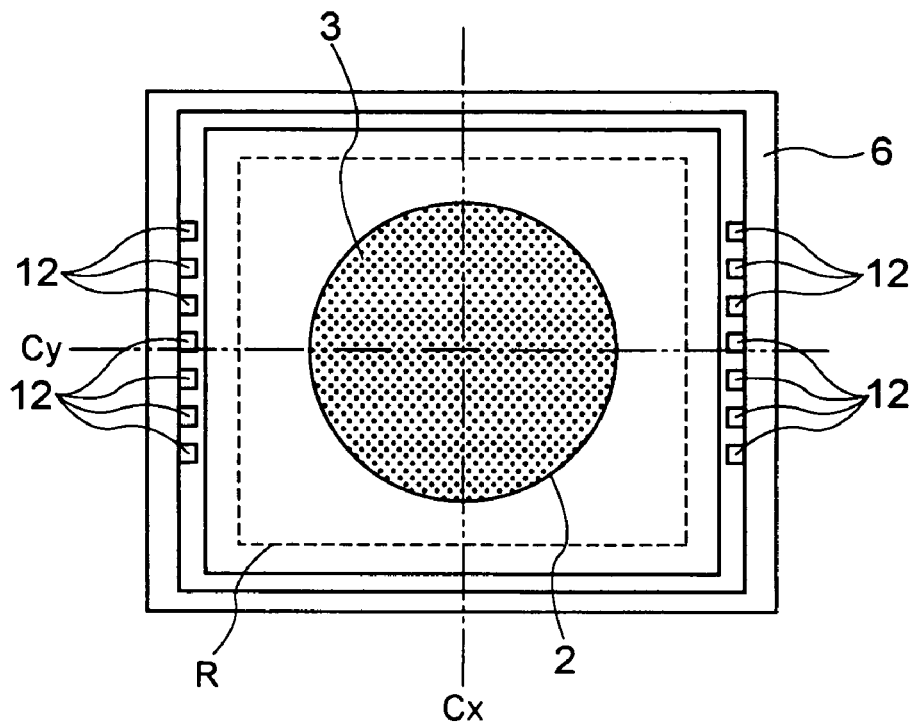
FIG. 12A is a plan view of another semiconductor acceleration sensor device when a different low elasticity element is used as compared with the low elasticity element shown in FIG. 11A.
Figure 12B:
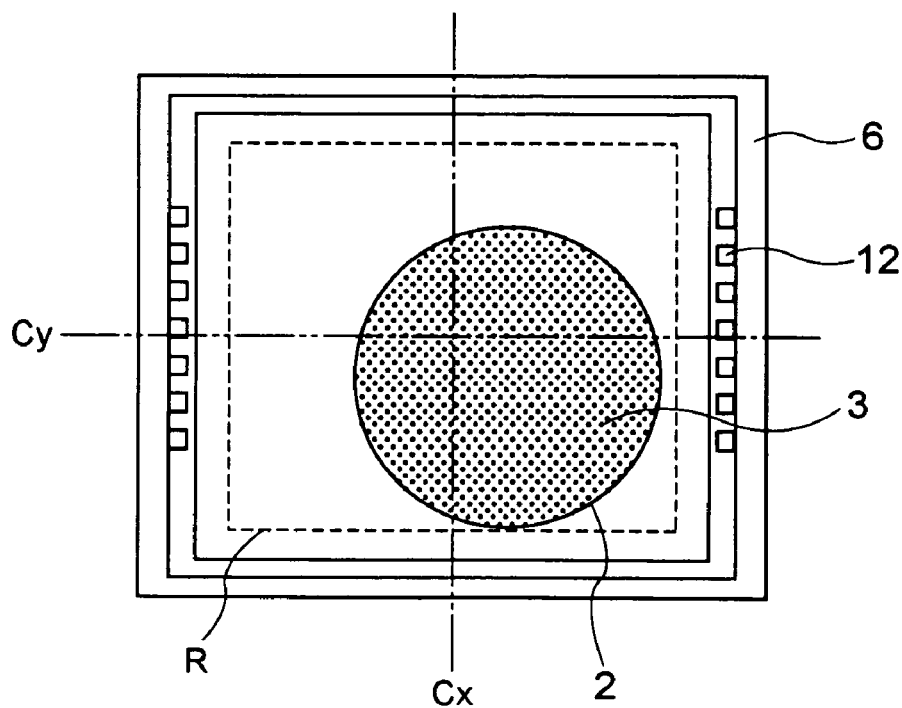
FIG. 12B is a plan view of still another semiconductor acceleration sensor device when a different low elasticity element is used as compared with the low elasticity element shown in FIG. 11A.

FIG. 10B is a plan view depicting the semiconductor acceleration sensor device of the third embodiment. FIG. 10A is a cross-sectional view of the semiconductor acceleration sensor device of the third embodiment, taken along the line 10A-10A in FIG. 10B. FIG. 11A is a plan view depicting the semiconductor acceleration sensor device of the third embodiment when the top cover 10, adhesive 8, wires 14 and acceleration sensor chip 4 are removed. FIG. 11B is a plan view depicting the acceleration sensor chip 4 mounted on the low elasticity element 3 in FIG. 11A. FIG. 12A is an example when the shape, size and/or position of the low elasticity element 3 is different from that of the low elasticity element 3 in FIG. 11A. FIG. 12B is another example when the shape, size and/or position of the low elasticity element 3 is different from that of the low elasticity element 3 in FIG. 11A.

The structure of the semiconductor acceleration sensor device of the third embodiment is different from the semiconductor acceleration sensor device of the first embodiment in the low elasticity element 3. Specifically, the shape of the low elasticity element 3 is a true circle.

As shown in FIG. 10A and FIG. 11A, the concave section 2 is formed to be a true circle in the predetermined area R on the bottom face 5. The low elasticity element 3 is formed so as to fill the concave section 2, and is partitioned by the side walls of the concave section 2. Therefore, the shape, size and position of the low elasticity element 3 are the same as those of the concave section 2. The low elasticity element 3 has a 0.9 mm radius, and is positioned at a location where the circumference of the circular element 3 contacts the four sides of the square area R. The true circular low elasticity element 3 is placed in the predetermined area R so that it is symmetric with respect to the center line Cx of the area R in the x axis direction, and also is symmetric with respect to the center line Cy of the area R in the y axis direction. In the third embodiment, the low elasticity element 3 of which circumference contacts the four sides constituting the predetermined area R is naturally positioned to be symmetric with respect to both the center lines Cx and Cy. As shown in FIG. 12A, if the shape of the low elasticity element 3 is a true circle and the size thereof is smaller than the predetermined area R, then the low elasticity element 3 is symmetric with respect to both the center lines Cx and Cy only when the low elasticity element 3 is located at the position shown in FIG. 12A. If the low elasticity element 3, of which shape is a true cycle and the size is smaller than that of the predetermined area R, is positioned as shown in FIG. 12B, for example, the low elasticity element 3 is not symmetric with respect to both the center lines Cx and Cy. In FIG. 12B, the low elasticity element 3 is not symmetric with respect to the center line Cx and not symmetric with respect to the center line Cy.

As FIG. 10A and FIG. 11B show, the acceleration sensor chip 4 is mounted on the true circular low elasticity element 3, and the shape, size and position of the acceleration sensor chip 4 are the same as those of the predetermined area R. Therefore, in FIG. 11B, the acceleration sensor chip 4 is positioned so as to cover the true circular low elasticity element 3 completely.

The semiconductor acceleration sensor device of the third embodiment has two advantages similar to the semiconductor acceleration sensor device of the first embodiment. Specifically, the first advantage is that the low elasticity element 3 is partitioned by the side walls of the concave section 2, so that a dimensional change of the low elasticity element 3 in the horizontal direction when the ambient temperature is changed can be suppressed. The second advantage is that the shape, size and position of the acceleration sensor chip 4 are the same as those of the predetermined area R, and the shape of the low elasticity element 3 formed in the predetermined area R is symmetric with respect to both the center lines Cx and Cy of the predetermined area R in the x axis direction and the y axis direction. Therefore, the stress to be applied from the low elasticity element 3 to the acceleration sensor chip 4 when the ambient temperature is changed can be evenly distributed.

The third embodiment also has the following third and fourth advantages. The third advantage is that the low elasticity element 3 is a circle, so that the dimensional change when the ambient temperature is changed can be suppressed even more, as compared with a rectangular low elasticity element (e.g., low elasticity element 3 of the first embodiment) having the sides of which length is the same as the diameter of the circular element 3. In other words, in the case of a rectangular low elasticity element 3, the dimensional change when the ambient temperature is changed is greatest in the areas near the four corners. On the other hand, the circular low elasticity element 3 has no corners. Since the four corners of the acceleration sensor chip 4 do not contact the element 3, the stress to be applied to the acceleration sensor chip 4 when the ambient temperature is changed can be further suppressed. Particularly in the third embodiment, the low elasticity element 3 is a true circle, so that the stress to be applied from the low elasticity element 3 to the acceleration sensor chip 4 when the ambient temperature is changed can be more evenly distributed than the case of an oval low elasticity element. The fourth advantage is that the circumference of the circular low elasticity element 3 contacts the four sides of the predetermined area R, so that the acceleration sensor chip 4 can be adhered stably while achieving the third advantage.

The fabrication method of the semiconductor acceleration sensor device of the third embodiment is different from the fabrication method of the first embodiment in the preparation of the concave section 2. Specifically, the concave section 2 is molded to be the shape (true circle) and size at the position shown in FIG. 10A and FIG. 11A in the fabrication step of FIGS. 4B and 4B'. This means that the low elasticity element 3 filled in the concave section 2 is also formed as shown in FIG. 10A and FIG. 11A. Except that the shape, size and position of the concave section 2 and the low elasticity element 3 are different, the fabrication method of the third embodiment is the same as the fabrication method of the first embodiment.

The fabrication method of the semiconductor acceleration sensor device of the third embodiment has a similar advantage to the fabrication method of the first embodiment. Specifically, the low elasticity element 3 is formed accurately by filling the liquefied low elasticity element 3 into the concave section 2 made in the bottom face 5 in advance.

The fabrication method of the semiconductor acceleration sensor device of the third embodiment has additional advantages. Specifically, because the concave section 2 is circular, the liquefied silicon rubber (low elasticity element) 3 spreads like a growing circle when the silicon rubber liquefied at high temperature is filled into the concave section 2 in FIG. 4C. Therefore, the liquefied silicon rubber can form the desired shape of the low elasticity element 3 in a naturally spreading status. In other words, as compared with the case of a rectangular concave section 2, the low elasticity element 3 can be naturally formed, and the desired shape always results. Particularly in the third embodiment, because the shape of the low elasticity element 3 is a true circle, the shape of the low elasticity element 3 can be formed according to the natural spread of the liquefied low elasticity element 3, when compared with the case of an ellipse.

Fourth Embodiment

The structure and fabrication method of the semiconductor acceleration sensor device according to the fourth embodiment of the present invention will now be described with reference to FIG. 13A through FIG. 15B and FIG. 4A through FIG. 4E. Description of the fourth embodiment which is the same as that of the structure and fabrication method of the semiconductor acceleration sensor device according to the first embodiment will be omitted.

Figure 13A:
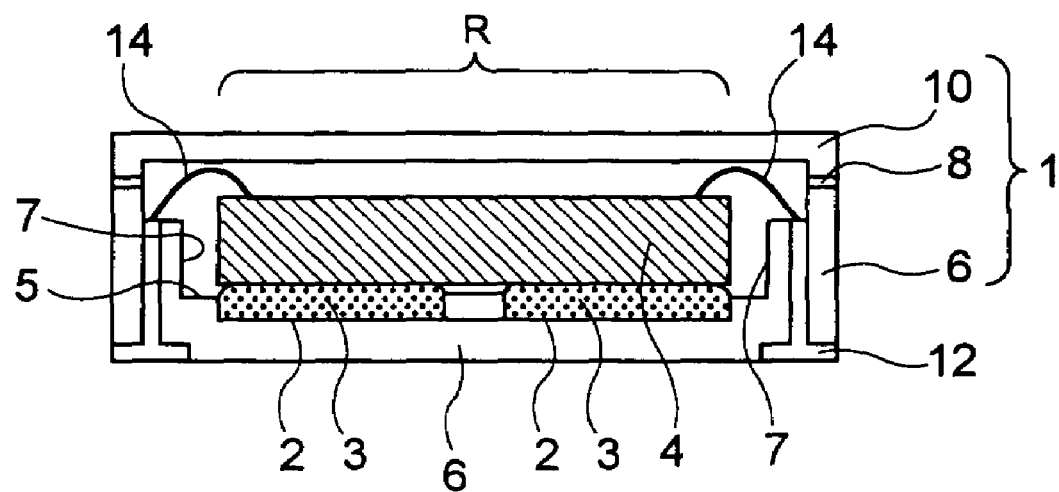
FIG. 13A is a cross-sectional view of a semiconductor acceleration sensor device according to the fourth embodiment, taken along the line 13A-13A in FIG. 13B.
Figure 13B:
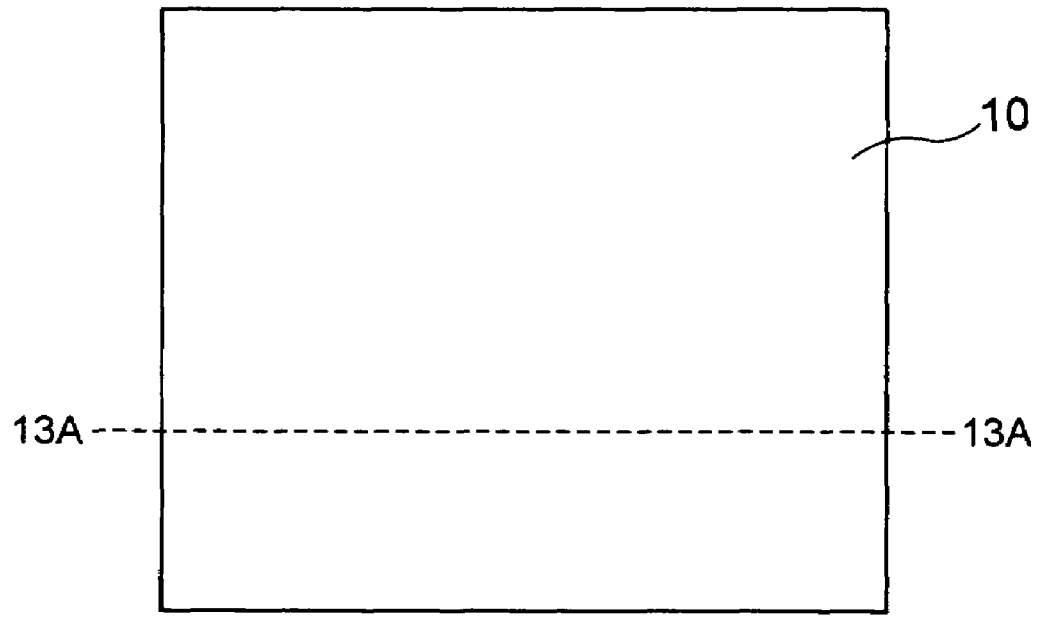
FIG. 13B is a plan view depicting the semiconductor acceleration sensor device according to the fourth embodiment.
Figure 14A:
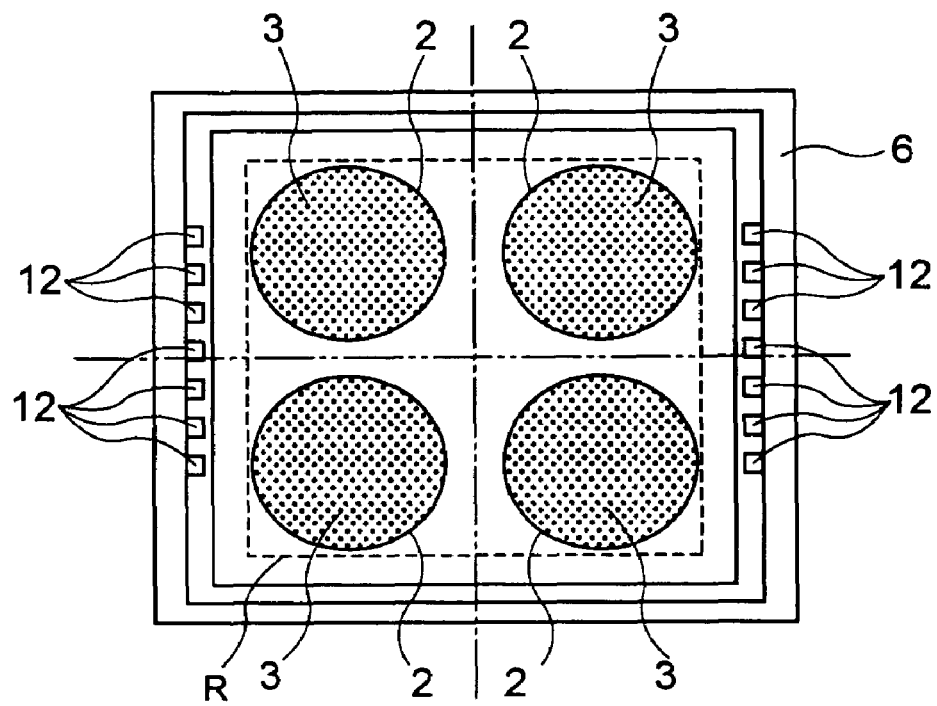
FIG. 14A is a plan view depicting the structure of the semiconductor acceleration sensor device according to the fourth embodiment when a top cover and other elements are removed.
Figure 14B:
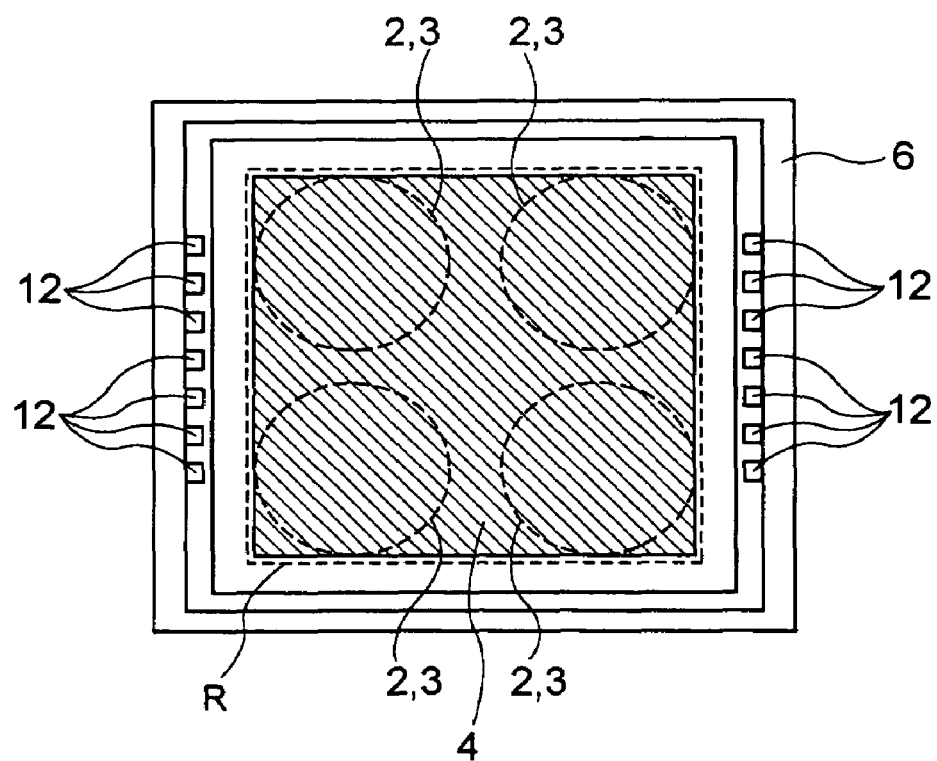
FIG. 14B is another plan view of the semiconductor acceleration sensor device according to the fourth embodiment.
Figure 15A:
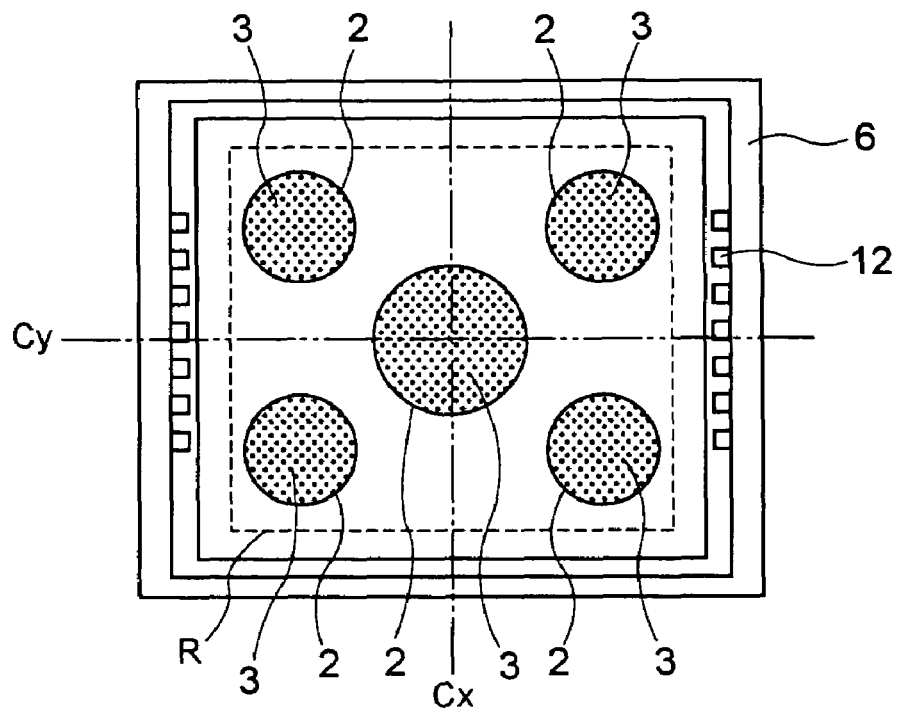
FIG. 15A is a plan view of another semiconductor acceleration sensor device when different low elasticity elements are used as compared with the low elasticity elements shown in FIG. 14A.
Figure 15B:
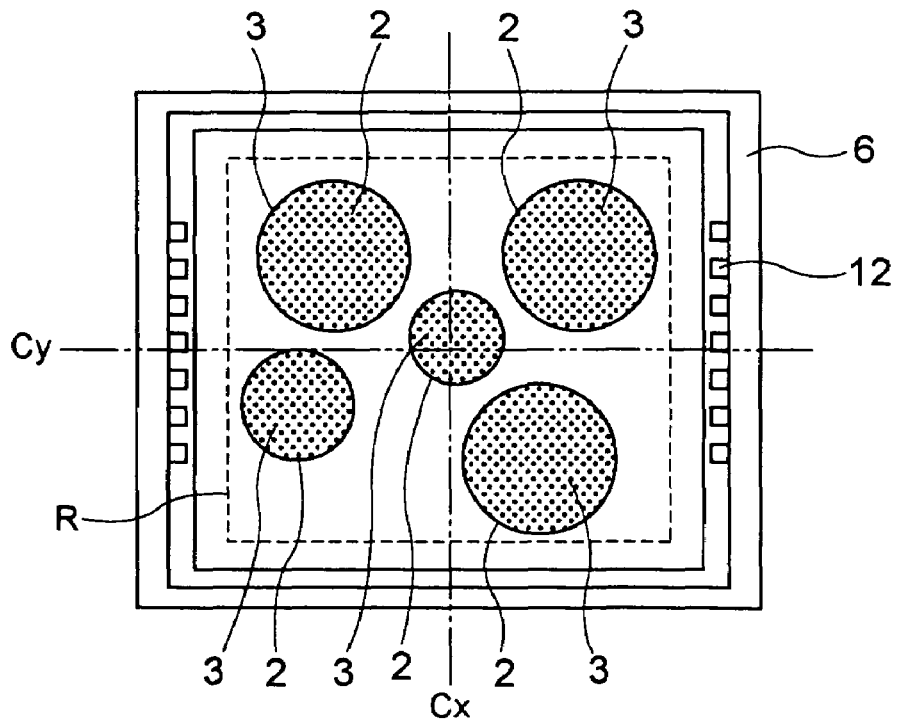
FIG. 15B is a plan view of still another semiconductor acceleration sensor device when different low elasticity elements are used as compared with the low elasticity elements shown in FIG. 14A.
Figure 16:
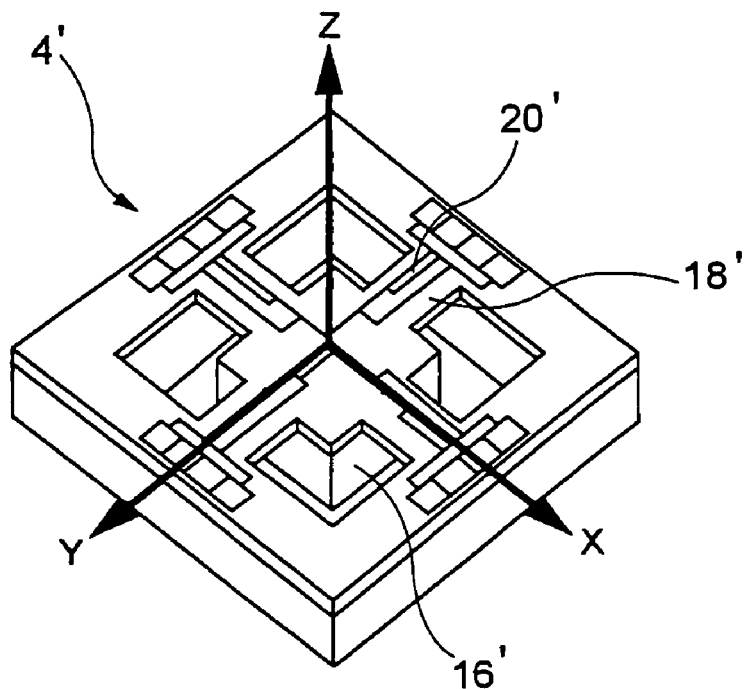
FIG. 16 is a perspective view of the acceleration sensor chip.

FIG. 13B is a plan view depicting the semiconductor acceleration sensor device of the fourth embodiment. FIG. 13A is a cross-sectional view of the semiconductor acceleration sensor device of the fourth embodiment, taken along the line 13A-13A in FIG. 13B. FIG. 14A is a plan view depicting the semiconductor acceleration sensor device of the fourth embodiment when the top cover 10, adhesive 8, wires 14 and acceleration sensor chip 4 are removed. FIG. 14B is a plan view depicting the acceleration sensor chip 4 mounted on the low elasticity element 3 in FIG. 14A. FIG. 15A is an example when the shape, size and/or position of the low elasticity element 3 is different from that of the low elasticity element 3 in FIG. 14A. FIG. 15B is another example when the shape, size and/or position of the low elasticity element 3 is different from that of the low elasticity element 3 in FIG. 14A.

The structure of the semiconductor acceleration sensor device of the fourth embodiment is different from the semiconductor acceleration sensor device of the first embodiment in the low elasticity element 3. Specifically, the true circular low elasticity elements 3 are formed in the predetermined area R at four locations.

As shown in FIG. 13A and FIG. 14A, the circular concave sections 2 are formed at four locations in the predetermined area R on the bottom face 5. The low elasticity elements 3 are formed so as to fill the four concave sections 2 respectively, and are partitioned by the side walls of the respective concave sections 2. Therefore, the shape, size and position of the low elasticity elements 3 are the same as those of the associated concave sections 2 respectively. Each low elasticity element 3 is a circle of which radius is 0.4 mm. The closest distance between adjacent low elasticity elements 3 is 0.2 mm. The four low elasticity elements 3 are positioned so that each element 3 contacts two sides defining one corner of the square area R. The four low elasticity elements 3 are positioned in the predetermined area R so that the low elasticity elements 3 are symmetric with respect to the center line Cx of the area R in the x axis direction, and also is symmetric with respect to the center line Cy of the area R in the y axis direction. In the fourth embodiment, the four circular low elasticity elements 3, of which shape and size are the same, are positioned so that each contacts the two sides forming the particular corner of the predetermined area R. Accordingly, the low elasticity elements 3 are naturally positioned to be symmetric with respect to both the center lines Cx and Cy. If there are five low elasticity elements 3, of which shape and size are not all the same as shown in FIG. 15A, for example, the low elasticity elements 3 are symmetric with respect to both the center lines Cx and Cy when the low elasticity elements 3 are positioned as shown in FIG. 15A. However, if the five low elasticity elements 3, of which sizes are not the same, are positioned as shown in FIG. 15B, for example, the low elasticity elements 3 are not symmetric with respect to both the center lines Cx and Cy. In FIG. 15B, the low elasticity elements are not symmetric with respect to the center line Cx and not symmetric with respect to the center line Cy.

As FIG. 13A and FIG. 14B show, the acceleration sensor chip 4 is mounted over the four circular low elasticity elements 4, and the shape, size and position of the acceleration sensor chip 4 are the same as those of the predetermined area R. Therefore in FIG. 14B, the acceleration sensor chip 4 is positioned so as to cover the four concave sections 2 and the four low elasticity elements 3 completely.

The semiconductor acceleration sensor device of the fourth embodiment has three advantages similar to the semiconductor acceleration sensor devices of the first and second embodiments. Specifically, the first advantage is that the four low elasticity elements 3 are partitioned by the side walls of the four concave sections 2 respectively, so that the dimensional change of the low elasticity elements 3 in the horizontal direction when the ambient temperature is changed can be suppressed. The second advantage is that a plurality of low elasticity elements 3 are formed in the predetermined area R, so that each low elasticity element 3 is smaller than the low elasticity element 3 of the first embodiment. The dimensional change of the low elasticity element 3 when the ambient temperature is changed is smaller as the size of the low elasticity element 3 is smaller. Thus, the stress to be applied to the acceleration sensor chip 4 adhered to the low elasticity elements 3 can be decreased even more so than the first embodiment. Since the distortion generated in the acceleration sensor chip 4 due to the temperature changes is further suppressed, the detection accuracy of the acceleration sensor can be improved. The third advantage is that the shape, size and position of the acceleration sensor chip 4 are the same as those of the predetermined area R, and the shapes of the low elasticity elements 3 in the predetermined area R are symmetric with respect to both the center lines Cx and Cy of the predetermined area R in the x axis direction and the y axis direction. Therefore, the stress to be applied from the low elasticity elements 3 to the acceleration sensor chip 4 when the ambient temperature is changed can be evenly distributed.

The fourth embodiment also has the following fourth and fifth advantages. The fourth advantage is that each of the low elasticity elements 3 is a circle, so that the dimensional change when the ambient temperature is changed can be more suppressed, as compared with rectangular low elasticity elements (e.g., the low elasticity elements 3 of the second embodiment in FIG. 8A) having the sides of which length is the same as the diameter of the circular low elasticity element. In the rectangular low elasticity element 3, the dimensional change when the ambient temperature is changed is greatest in the four corner areas of the rectangle. The circular low elasticity element 3 does not have such corner areas. Therefore, the acceleration sensor chip 4 does not contact such corner areas, so that the stress to be applied to the acceleration sensor chip 4 when the ambient temperature is changed can be further suppressed than the semiconductor acceleration sensor device of the second embodiment. Particularly in the fourth embodiment, because the four low elasticity elements 3 are true circles, the stress to be applied from the low elasticity elements 3 to the acceleration sensor chip 4 when the ambient temperature is changed can be more evenly distributed than the case of an ellipse. The fifth advantage is that the four circular low elasticity elements 3 are positioned so that each contacts the two sides constituting one corner of the square area R. Thus, the acceleration sensor chip 4 can be adhered stably while obtaining the fourth advantage.

The fabrication method of the semiconductor acceleration sensor device of the fourth embodiment is different from the fabrication method of the first embodiment in the preparation of the concave sections 2. Specifically, the four concave sections 2 are molded to be the shape (true circle) and size at the positions shown in FIG. 13A and FIG. 14A in the fabrication step of FIG. 4B and FIG. 4B'. This means that the low elasticity element 3 filled in the concave section 2 is also formed as shown in FIG. 13A and FIG. 14A. Except that the shape, size and position of the concave section 2 and the low elasticity element 3 are different, the fabrication method of the fourth embodiment is the same as the fabrication method of the semiconductor acceleration sensor device of the first embodiment.

The fabrication method of the semiconductor acceleration sensor device of the fourth embodiment has two advantages similar to the fabrication method of the semiconductor acceleration sensor devices of the first and third embodiments. The first advantage is that the low elasticity element 3 can be formed accurately by filling the liquefied low elasticity element 3 into the concave sections 2 made in the bottom face 5 in advance. The second advantage is the easy formation of the low elasticity element 3. Each concave section 2 is circular so that the silicon rubber 3 liquefied at high temperature spreads like a growing circle when the liquid silicon rubber is filled in the concave section 2 in FIG. 4C. Therefore, the low elasticity element 3 can form the desired shape in a naturally spreading status in each concave section 2. As compared with the case of a rectangular concave section 2, the low elasticity element 3 can be naturally formed, and the desired shape is obtained. Particularly in the fourth embodiment, because the shape of the low elasticity element 3 is a true circle, the shape of the low elasticity element 3 can be formed according to the natural spread of the liquefied low elasticity element 3 as compared with the case of an ellipse.

The present invention is not limited to the above described embodiments and modifications themselves. For example, the embodiments and modifications may be combined with each other. Specifically, the first modified example or the second modified example of the first embodiment can be combined with the second embodiment, the third embodiment or the fourth embodiment. If the second modified example of the first embodiment is combined with the second embodiment, the acceleration sensor chip 4 smaller than the predetermined area R of the second embodiment may be positioned on four square low elasticity elements 3.

This application is based on Japanese Patent Application No. 2005-157920 filed on May 30, 2005, and the entire disclosure thereof is incorporated herein by reference.

What is claimed is:

1. A semiconductor acceleration sensor device comprising:
   an acceleration sensor chip;
   a hollow package for housing the acceleration sensor chip;
   a concave section being formed in a predetermined area on a bottom face inside said package; and
   a low elasticity element with adhesiveness, which is filled in said concave section;
   said acceleration sensor chip being mounted on said low elasticity element, and an adhesive surface between said low elasticity element and said acceleration sensor chip being higher than said bottom face.

2. The semiconductor acceleration sensor device according to claim 1, wherein said low elasticity element has the same shape, size and position as said concave section.

3. The semiconductor acceleration sensor device according to claim 2, wherein said low elasticity element has a rectangular shape.

4. The semiconductor acceleration sensor device according to claim 3, wherein said predetermined area is a rectangle having two center lines crisscrossing each other,
   said low elasticity element is formed at one location inside said predetermined area, and is positioned to be symmetric with respect to said two center lines of said predetermined area, and
   said acceleration sensor chip has the same shape, size and position as said predetermined area.

5. The semiconductor acceleration sensor device according to claim 4, wherein said low elasticity element has the same shape, size and position as said predetermined area.

6. The semiconductor acceleration sensor device according to claim 5, wherein said predetermined area is substantially square.

7. The semiconductor acceleration sensor device according to claim 3, wherein said low elasticity element includes a plurality of pieces which are formed at a plurality of locations in said predetermined area.

8. The semiconductor acceleration sensor device according to claim 7, wherein said predetermined area is a rectangle having two crisscrossing center lines,
   said plurality of pieces of said low elasticity element are positioned to be symmetric with respect to said two center lines of said predetermined area, and
   said acceleration sensor chip has the same shape, size and position as said predetermined area.

9. The semiconductor acceleration sensor device according to claim 8, wherein said predetermined area is substantially square having four corners,
   said low elasticity element includes four pieces, and
   said four pieces are positioned in contact with the four corners of said predetermined area respectively.

10. The semiconductor acceleration sensor device according to claim 2, wherein said low elasticity element has a circular shape.

11. The semiconductor acceleration sensor device according to claim 10, wherein said predetermined area is a rectangle having four sides and two crisscrossing center lines,
    said circular low elasticity element is formed at one location in said predetermined area and is positioned to be symmetric with respect to said two center lines of said predetermined area, and
    said acceleration sensor chip has the same shape, size and position as said predetermined area.

12. The semiconductor acceleration sensor device according to claim 11, wherein a circumference of said circular low elasticity element contacts said four sides of said predetermined area.

13. The semiconductor acceleration sensor device according to claim 10, wherein said predetermined area is a rectangle having two crisscrossing center lines,
    said circular low elasticity element includes a plurality of circular pieces which are formed at a plurality of locations in said predetermined area, and
    said plurality of circular pieces are positioned to be symmetric with respect to said two center lines of said predetermined area, and
    said acceleration sensor chip has the same shape, size and position as said predetermined area.

14. The semiconductor acceleration sensor device according to claim 13, wherein said predetermined area is a substantially square having four sides and four corners, said low elasticity element includes four circular pieces, and said four circular pieces of said low elasticity element are positioned in contact with said four corners of said predetermined area respectively, such that each said piece contacts two said sides defining one said corner of said predetermined area.

15. The semiconductor acceleration sensor device according to claim 1, wherein said adhesive surface is formed to be about 10 μm higher than said bottom face.

16. The semiconductor acceleration sensor device according to claim 1, wherein said low elasticity element is made of silicon rubber.

17. A semiconductor acceleration sensor device comprising:

a chip housing section having a first concave section which has side faces and a bottom face;

a second concave section being formed in a predetermined area on said bottom face;

a low elasticity element with adhesiveness, which is filled in said second concave section; and an acceleration sensor chip mounted on said low elasticity element, an adhesive surface between said low elasticity element and said acceleration sensor chip being higher than said bottom face.

18. A method of fabricating a semiconductor acceleration sensor device comprising:

preparing an acceleration sensor chip;

preparing a chip housing section having a concave section in a predetermined area on a bottom face thereof;

pouring a liquefied low elasticity element into said concave section to fill said concave section with said liquefied low elasticity element, such that a vertex portion on the surface of said low elasticity element becomes higher than said bottom faces, positioning said acceleration sensor chip on said low elasticity element and then adhering said low elasticity element to said acceleration sensor chip by solidifying said low elasticity element; and closing said chip housing section with a top cover.

* * * * *